US011706895B2

(12) United States Patent
Davis et al.

(10) Patent No.: US 11,706,895 B2
(45) Date of Patent: Jul. 18, 2023

(54) INDEPENDENT SCALING OF COMPUTE RESOURCES AND STORAGE RESOURCES IN A STORAGE SYSTEM

(71) Applicant: Pure Storage, Inc., Mountain View, CA (US)

(72) Inventors: John Davis, San Francisco, CA (US); Hari Kannan, Sunnyvale, CA (US); Robert Lee, San Carlos, CA (US); Yuhong Mao, Fremont, CA (US)

(73) Assignee: PURE STORAGE, INC., Mountain View, CA (US)

( * ) Notice: Subject to any disclaimer, the term of this patent is extended or adjusted under 35 U.S.C. 154(b) by 1590 days.

(21) Appl. No.: 15/213,447

(22) Filed: Jul. 19, 2016

(65) Prior Publication Data

US 2018/0027681 A1 Jan. 25, 2018

(51) Int. Cl.
*H05K 7/14* (2006.01)

(52) U.S. Cl.
CPC .................. *H05K 7/1498* (2013.01)

(58) Field of Classification Search
CPC ... H05K 7/1487; H05K 7/1489; H05K 7/1492
See application file for complete search history.

(56) References Cited

U.S. PATENT DOCUMENTS

| 5,390,327 A | 2/1995 | Lubbers et al. |
| 5,479,653 A | 12/1995 | Jones |
| 5,706,210 A | 1/1998 | Kumano et al. |
| 5,799,200 A | 8/1998 | Brant et al. |

(Continued)

FOREIGN PATENT DOCUMENTS

| EP | 0725324 A2 | 8/1996 |
| EP | 2164006 A2 | 3/2010 |

(Continued)

OTHER PUBLICATIONS

Zhang et al., *Application-Aware and Software-Defined SSD Scheme for Tencent Large-Scale Storage System*, 2016 IEEE 22nd International Conference on Parallel and Distributed Systems, Dec. 2016, pp. 482-490, Institute of Electrical and Electronics Engineers (IEEE) Computer Society, Digital Object Identifier: 10.1109/ICPADS.2016.0071, USA.

(Continued)

*Primary Examiner* — Anthony Q Edwards
*Assistant Examiner* — Hung Q Dang

(57) ABSTRACT

A storage system that supports independent scaling of compute resources and storage resources, the storage system including: one or more chassis, wherein each chassis includes a plurality of slots, each slot configured to receive a blade; a plurality of compute resources; a plurality of storage resources; a plurality of blades, where each blade includes at least one compute resource or at least one storage resource and each of the storage resources may be directly accessed by each of the compute resources without utilizing an intermediate compute resource; a first power domain configured to deliver power to one or more of the compute resources; and a second power domain configured to deliver power to the storage resources, wherein the first power domain and the second power domain can be independently operated.

12 Claims, 9 Drawing Sheets

(56) References Cited

U.S. PATENT DOCUMENTS

| | | | |
|---|---|---|---|
| 5,933,598 A | 8/1999 | Scales et al. | |
| 6,012,032 A | 1/2000 | Donovan et al. | |
| 6,085,333 A | 7/2000 | DeKoning et al. | |
| 6,275,898 B1 | 8/2001 | DeKoning | |
| 6,643,641 B1 | 11/2003 | Snyder | |
| 6,643,748 B1 | 11/2003 | Wieland | |
| 6,647,514 B1 | 11/2003 | Umberger et al. | |
| 6,725,392 B1 | 4/2004 | Frey et al. | |
| 6,728,807 B1* | 4/2004 | Laursen | G06F 15/17375 370/357 |
| 6,789,162 B1 | 9/2004 | Talagala et al. | |
| 6,868,082 B1* | 3/2005 | Allen, Jr. | G06F 13/4022 370/360 |
| 6,985,995 B2 | 1/2006 | Holland et al. | |
| 6,996,615 B1* | 2/2006 | McGuire | G06F 9/505 709/224 |
| 7,069,383 B2 | 6/2006 | Yamamoto et al. | |
| 7,076,606 B2 | 7/2006 | Orsley | |
| 7,089,272 B1 | 8/2006 | Garthwaite et al. | |
| 7,107,389 B2 | 9/2006 | Inagaki et al. | |
| 7,146,521 B1 | 12/2006 | Nguyen | |
| 7,159,150 B2 | 1/2007 | Kenchammana-Hosekote | |
| 7,162,575 B2 | 1/2007 | Dalal et al. | |
| 7,290,059 B2* | 10/2007 | Yadav | H04L 29/06 709/242 |
| 7,334,124 B2 | 2/2008 | Pham et al. | |
| 7,334,156 B2 | 2/2008 | Land et al. | |
| 7,437,530 B1 | 10/2008 | Rajan | |
| 7,466,704 B2* | 12/2008 | Kalkunte | H04L 43/00 370/392 |
| 7,493,424 B1 | 2/2009 | Bali et al. | |
| 7,558,859 B2 | 7/2009 | Kasiolas | |
| 7,613,947 B1 | 11/2009 | Coatney | |
| 7,669,029 B1 | 2/2010 | Mishra et al. | |
| 7,681,104 B1 | 3/2010 | Sim-Tang et al. | |
| 7,681,105 B1 | 3/2010 | Sim-Tang et al. | |
| 7,689,609 B2 | 3/2010 | Lango et al. | |
| 7,730,258 B1 | 6/2010 | Smith | |
| 7,743,191 B1 | 6/2010 | Liao | |
| 7,743,276 B2 | 6/2010 | Jacobsen et al. | |
| 7,757,038 B2 | 7/2010 | Kitahara | |
| 7,778,960 B1 | 8/2010 | Chatterjee et al. | |
| 7,814,272 B2 | 10/2010 | Barrall et al. | |
| 7,814,273 B2 | 10/2010 | Barrall | |
| 7,818,531 B2 | 10/2010 | Barrall | |
| 7,827,351 B2 | 11/2010 | Suetsugu et al. | |
| 7,827,439 B2 | 11/2010 | Matthew et al. | |
| 7,870,105 B2 | 1/2011 | Arakawa et al. | |
| 7,885,938 B1 | 2/2011 | Greene et al. | |
| 7,886,111 B2 | 2/2011 | Klemm et al. | |
| 7,899,780 B1 | 3/2011 | Shmuylovich et al. | |
| 7,908,448 B1 | 3/2011 | Chatterjee et al. | |
| 7,941,697 B2 | 5/2011 | Mathew et al. | |
| 7,958,303 B2 | 6/2011 | Shuster | |
| 7,971,129 B2 | 6/2011 | Watson | |
| 8,010,485 B1 | 8/2011 | Chatterjee et al. | |
| 8,010,829 B1 | 8/2011 | Chatterjee et al. | |
| 8,020,047 B2 | 9/2011 | Courtney | |
| 8,042,163 B1 | 10/2011 | Karr et al. | |
| 8,046,548 B1 | 10/2011 | Chatterjee et al. | |
| 8,051,361 B2 | 11/2011 | Sim-Tang et al. | |
| 8,051,362 B2 | 11/2011 | Li et al. | |
| 8,082,393 B2 | 12/2011 | Galloway et al. | |
| 8,086,585 B1 | 12/2011 | Brashers et al. | |
| 8,086,634 B2 | 12/2011 | Mimatsu | |
| 8,086,911 B1 | 12/2011 | Taylor | |
| 8,108,502 B2 | 1/2012 | Tabbara et al. | |
| 8,117,388 B2 | 2/2012 | Jernigan, IV | |
| 8,145,838 B1 | 3/2012 | Miller et al. | |
| 8,145,840 B2 | 3/2012 | Koul et al. | |
| 8,149,828 B2* | 4/2012 | Kalkunte | H04L 43/00 370/389 |
| 8,176,360 B2 | 5/2012 | Frost et al. | |
| 8,244,999 B1 | 8/2012 | Chatterjee et al. | |
| 8,271,700 B1 | 9/2012 | Annem et al. | |
| 8,305,811 B2 | 11/2012 | Jeon | |
| 8,315,999 B2 | 11/2012 | Chatley et al. | |
| 8,327,080 B1 | 12/2012 | Der | |
| 8,387,136 B2 | 2/2013 | Lee et al. | |
| 8,402,152 B2 | 3/2013 | Duran | |
| 8,412,880 B2 | 4/2013 | Leibowitz et al. | |
| 8,437,189 B1 | 5/2013 | Montierth et al. | |
| 8,465,332 B2 | 6/2013 | Hogan et al. | |
| 8,473,778 B2 | 6/2013 | Simitci | |
| 8,479,037 B1 | 7/2013 | Chatterjee et al. | |
| 8,498,967 B1 | 7/2013 | Chatterjee et al. | |
| 8,522,073 B2 | 8/2013 | Cohen | |
| 8,527,544 B1 | 9/2013 | Colgrove et al. | |
| 8,533,527 B2 | 9/2013 | Daikokuya et al. | |
| 8,566,546 B1 | 10/2013 | Marshak et al. | |
| 8,578,442 B1 | 11/2013 | Banerjee | |
| 8,595,455 B2 | 11/2013 | Chatterjee et al. | |
| 8,613,066 B1 | 12/2013 | Brezinski et al. | |
| 8,620,970 B2 | 12/2013 | English et al. | |
| 8,627,136 B2 | 1/2014 | Shankar et al. | |
| 8,627,138 B1 | 1/2014 | Clark | |
| 8,660,131 B2 | 2/2014 | Vermunt et al. | |
| 8,700,875 B1 | 4/2014 | Barron et al. | |
| 8,713,405 B2 | 4/2014 | Healey et al. | |
| 8,751,463 B1 | 6/2014 | Chamness | |
| 8,762,642 B2 | 6/2014 | Bates et al. | |
| 8,762,793 B2 | 6/2014 | Grube et al. | |
| 8,769,622 B2 | 7/2014 | Chang et al. | |
| 8,775,858 B2 | 7/2014 | Gower et al. | |
| 8,775,868 B2 | 7/2014 | Colgrove et al. | |
| 8,788,913 B1 | 7/2014 | Xin et al. | |
| 8,799,746 B2 | 8/2014 | Baker et al. | |
| 8,800,009 B2 | 8/2014 | Beda, III et al. | |
| 8,812,860 B1 | 8/2014 | Bray | |
| 8,819,383 B1 | 8/2014 | Jobanputra et al. | |
| 8,843,700 B1 | 9/2014 | Salessi et al. | |
| 8,850,108 B1 | 9/2014 | Hayes et al. | |
| 8,850,288 B1 | 9/2014 | Lazier et al. | |
| 8,850,546 B1 | 9/2014 | Field et al. | |
| 8,856,593 B2 | 10/2014 | Eckhardt et al. | |
| 8,862,847 B2 | 10/2014 | Feng et al. | |
| 8,868,825 B1 | 10/2014 | Hayes | |
| 8,874,836 B1 | 10/2014 | Hayes | |
| 8,898,346 B1 | 11/2014 | Simmons | |
| 8,898,383 B2 | 11/2014 | Yamamoto et al. | |
| 8,898,388 B1 | 11/2014 | Kimmel | |
| 8,909,854 B2 | 12/2014 | Yamagishi et al. | |
| 8,918,478 B2 | 12/2014 | Ozzie et al. | |
| 8,931,041 B1 | 1/2015 | Banerjee | |
| 8,949,863 B1 | 2/2015 | Coatney et al. | |
| 8,984,602 B1 | 3/2015 | Bailey et al. | |
| 8,990,905 B1 | 3/2015 | Bailey et al. | |
| 9,021,053 B2 | 4/2015 | Bernbo et al. | |
| 9,025,393 B2 | 5/2015 | Wu | |
| 9,053,808 B2 | 6/2015 | Sprouse | |
| 9,058,155 B2 | 6/2015 | Cepulis et al. | |
| 9,116,819 B2 | 8/2015 | Cope et al. | |
| 9,117,536 B2 | 8/2015 | Yoon | |
| 9,124,569 B2 | 9/2015 | Hussain et al. | |
| 9,134,922 B2 | 9/2015 | Rajagopal et al. | |
| 9,201,733 B2 | 12/2015 | Verma | |
| 9,209,973 B2 | 12/2015 | Aikas et al. | |
| 9,250,687 B1* | 2/2016 | Aswadhati | G06F 1/3225 |
| 9,250,823 B1 | 2/2016 | Kamat et al. | |
| 9,300,660 B1 | 3/2016 | Borowiec et al. | |
| 9,392,720 B1* | 7/2016 | Kim | H05K 7/1492 |
| 9,411,656 B2* | 8/2016 | Jindal | G06F 9/5083 |
| 9,444,822 B1 | 9/2016 | Borowiec et al. | |
| 9,507,532 B1 | 11/2016 | Colgrove et al. | |
| 9,829,066 B2 | 11/2017 | Thomas et al. | |
| 9,967,342 B2* | 5/2018 | Colgrove | H04L 67/1097 |
| 2002/0013802 A1 | 1/2002 | Mori et al. | |
| 2003/0145172 A1 | 7/2003 | Galbraith et al. | |
| 2003/0191783 A1 | 10/2003 | Wolczko et al. | |
| 2003/0225961 A1 | 12/2003 | Chow et al. | |
| 2004/0080985 A1 | 4/2004 | Chang et al. | |
| 2004/0111573 A1 | 6/2004 | Garthwaite | |
| 2004/0153844 A1 | 8/2004 | Ghose et al. | |

(56) References Cited

U.S. PATENT DOCUMENTS

| | | |
|---|---|---|
| 2004/0193814 A1 | 9/2004 | Erickson et al. |
| 2004/0210887 A1* | 10/2004 | Bergen .................... G06F 11/36 717/168 |
| 2004/0260967 A1 | 12/2004 | Guha et al. |
| 2005/0160416 A1 | 7/2005 | Jamison |
| 2005/0188246 A1 | 8/2005 | Emberty et al. |
| 2005/0216800 A1 | 9/2005 | Bicknell et al. |
| 2006/0015771 A1 | 1/2006 | Vana Gundy et al. |
| 2006/0129817 A1 | 6/2006 | Borneman et al. |
| 2006/0161726 A1 | 7/2006 | Lasser |
| 2006/0174157 A1 | 8/2006 | Barrall et al. |
| 2006/0230245 A1 | 10/2006 | Gounares et al. |
| 2006/0239075 A1 | 10/2006 | Williams et al. |
| 2007/0022227 A1 | 1/2007 | Miki |
| 2007/0028068 A1 | 2/2007 | Golding et al. |
| 2007/0055702 A1 | 3/2007 | Fridella et al. |
| 2007/0079068 A1 | 4/2007 | Draggon |
| 2007/0109856 A1 | 5/2007 | Pellicone et al. |
| 2007/0150689 A1 | 6/2007 | Pandit et al. |
| 2007/0168321 A1 | 7/2007 | Saito et al. |
| 2007/0214194 A1 | 9/2007 | Reuter |
| 2007/0214314 A1 | 9/2007 | Reuter |
| 2007/0220227 A1 | 9/2007 | Long |
| 2007/0268905 A1 | 11/2007 | Baker et al. |
| 2007/0294563 A1 | 12/2007 | Bose |
| 2007/0294564 A1 | 12/2007 | Reddin et al. |
| 2008/0005587 A1 | 1/2008 | Ahlquist |
| 2008/0016206 A1* | 1/2008 | Ma .................... H04L 43/0817 709/224 |
| 2008/0077825 A1 | 3/2008 | Bello et al. |
| 2008/0155191 A1 | 6/2008 | Anderson et al. |
| 2008/0162674 A1 | 7/2008 | Dahiya |
| 2008/0195833 A1 | 8/2008 | Park |
| 2008/0270678 A1 | 10/2008 | Cornwell et al. |
| 2008/0282045 A1 | 11/2008 | Biswas et al. |
| 2008/0295118 A1 | 11/2008 | Liao |
| 2009/0077340 A1 | 3/2009 | Johnson et al. |
| 2009/0100115 A1 | 4/2009 | Park et al. |
| 2009/0198889 A1 | 8/2009 | Ito et al. |
| 2010/0052625 A1 | 3/2010 | Cagno et al. |
| 2010/0211723 A1 | 8/2010 | Mukaida |
| 2010/0246266 A1 | 9/2010 | Park et al. |
| 2010/0257142 A1 | 10/2010 | Murphy et al. |
| 2010/0262764 A1 | 10/2010 | Liu et al. |
| 2010/0268908 A1 | 10/2010 | Ouyang et al. |
| 2010/0325345 A1 | 12/2010 | Ohno et al. |
| 2010/0332754 A1 | 12/2010 | Lai et al. |
| 2011/0035540 A1 | 2/2011 | Fitzgerald et al. |
| 2011/0072290 A1 | 3/2011 | Davis et al. |
| 2011/0125955 A1 | 5/2011 | Chen |
| 2011/0131231 A1 | 6/2011 | Haas et al. |
| 2011/0167221 A1 | 7/2011 | Pangal et al. |
| 2011/0302369 A1 | 12/2011 | Goto et al. |
| 2012/0023144 A1 | 1/2012 | Rub |
| 2012/0054264 A1 | 3/2012 | Haugh et al. |
| 2012/0079318 A1 | 3/2012 | Colgrove et al. |
| 2012/0131253 A1 | 5/2012 | McKnight et al. |
| 2012/0198152 A1 | 8/2012 | Terry et al. |
| 2012/0226934 A1 | 9/2012 | Rao |
| 2012/0303919 A1 | 11/2012 | Hu et al. |
| 2012/0311000 A1 | 12/2012 | Post et al. |
| 2012/0311557 A1 | 12/2012 | Resch |
| 2013/0007845 A1 | 1/2013 | Chang et al. |
| 2013/0031414 A1 | 1/2013 | Dhuse et al. |
| 2013/0036272 A1 | 2/2013 | Nelson |
| 2013/0060884 A1 | 3/2013 | Bernbo et al. |
| 2013/0071087 A1 | 3/2013 | Motiwala et al. |
| 2013/0073894 A1 | 3/2013 | Xavier et al. |
| 2013/0124776 A1 | 5/2013 | Hallak et al. |
| 2013/0145447 A1 | 6/2013 | Maron |
| 2013/0151771 A1 | 6/2013 | Tsukahara et al. |
| 2013/0191555 A1 | 7/2013 | Liu |
| 2013/0198459 A1 | 8/2013 | Joshi et al. |
| 2013/0205173 A1 | 8/2013 | Yoneda |
| 2013/0219164 A1 | 8/2013 | Hamid |
| 2013/0227201 A1 | 8/2013 | Talagala et al. |
| 2013/0290607 A1 | 10/2013 | Chang et al. |
| 2013/0311434 A1 | 11/2013 | Jones |
| 2013/0318297 A1 | 11/2013 | Jibbe et al. |
| 2013/0332614 A1 | 12/2013 | Brunk et al. |
| 2013/0335907 A1* | 12/2013 | Shaw .................... G06F 1/189 361/679.31 |
| 2014/0020083 A1 | 1/2014 | Fetik |
| 2014/0040702 A1 | 2/2014 | He et al. |
| 2014/0047263 A1 | 2/2014 | Coatney et al. |
| 2014/0068224 A1 | 3/2014 | Fan et al. |
| 2014/0074850 A1 | 3/2014 | Noel et al. |
| 2014/0082715 A1 | 3/2014 | Grajek et al. |
| 2014/0086146 A1 | 3/2014 | Kim et al. |
| 2014/0090009 A1 | 3/2014 | Li et al. |
| 2014/0096220 A1 | 4/2014 | Da Cruz Pinto et al. |
| 2014/0101434 A1 | 4/2014 | Senthurpandi et al. |
| 2014/0136880 A1 | 5/2014 | Shankar et al. |
| 2014/0164774 A1 | 6/2014 | Nord et al. |
| 2014/0173232 A1 | 6/2014 | Reohr et al. |
| 2014/0195636 A1 | 7/2014 | Karve et al. |
| 2014/0201512 A1 | 7/2014 | Seethaler et al. |
| 2014/0201541 A1 | 7/2014 | Paul et al. |
| 2014/0208155 A1 | 7/2014 | Pan |
| 2014/0215590 A1 | 7/2014 | Brand |
| 2014/0229654 A1 | 8/2014 | Goss et al. |
| 2014/0230017 A1 | 8/2014 | Saib |
| 2014/0258526 A1 | 9/2014 | Le Sant et al. |
| 2014/0282983 A1 | 9/2014 | Ju et al. |
| 2014/0285917 A1 | 9/2014 | Cudak et al. |
| 2014/0325262 A1 | 10/2014 | Cooper et al. |
| 2014/0351627 A1 | 11/2014 | Best et al. |
| 2014/0373104 A1 | 12/2014 | Gaddam et al. |
| 2014/0373126 A1 | 12/2014 | Hussain et al. |
| 2014/0380125 A1 | 12/2014 | Calder et al. |
| 2014/0380126 A1 | 12/2014 | Yekhanin et al. |
| 2015/0026387 A1 | 1/2015 | Sheredy et al. |
| 2015/0074463 A1 | 3/2015 | Jacoby et al. |
| 2015/0089569 A1 | 3/2015 | Sondhi et al. |
| 2015/0095515 A1 | 4/2015 | Krithivas et al. |
| 2015/0113203 A1 | 4/2015 | Dancho et al. |
| 2015/0121137 A1 | 4/2015 | McKnight et al. |
| 2015/0013492 A1 | 5/2015 | Anderson et al. |
| 2015/0149822 A1 | 5/2015 | Coronado et al. |
| 2015/0193169 A1 | 7/2015 | Sundaram et al. |
| 2015/0280959 A1 | 10/2015 | Vincent |
| 2015/0378888 A1 | 12/2015 | Zhang et al. |
| 2016/0098323 A1 | 4/2016 | Mutha et al. |
| 2016/0209901 A1* | 7/2016 | Wilcox ................ H05K 7/1492 |
| 2016/0350009 A1 | 12/2016 | Cerreta et al. |
| 2016/0352720 A1 | 12/2016 | Hu et al. |
| 2016/0352830 A1 | 12/2016 | Borowiec et al. |
| 2016/0352834 A1 | 12/2016 | Borowiec et al. |

FOREIGN PATENT DOCUMENTS

| | | |
|---|---|---|
| WO | WO-02-13033 | 2/2002 |
| WO | WO-2008103569 A1 | 8/2008 |
| WO | WO-2012/087648 A1 | 6/2012 |
| WO | WO2013071087 A1 | 5/2013 |
| WO | WO-2014/110137 A1 | 7/2014 |
| WO | WO-2016/015008 A1 | 12/2016 |
| WO | WO-2016/190938 A1 | 12/2016 |
| WO | WO-2016/195759 A1 | 12/2016 |
| WO | WO-2016/195958 A1 | 12/2016 |
| WO | WO-2016/195961 A1 | 12/2016 |

OTHER PUBLICATIONS

Bjørling, *OpenChannel Solid State Drives NVMe Specification*, Revision 1.2, Apr. 2016, 24 pages, LightNVM.io (online), URL: http://lightnvm.io/docs/Open-ChannelSSDInterfaceSpecification12-final.pdf.

Storer et al., *Pergamum: Replacing Tape with Energy Efficient, Reliable, Disk-Based Archival Storage*, Fast '08: 6th USENIX Conference on File and Storage Technologies, Feb. 2008 pp. 1-16, San Jose, CA.

(56) References Cited

OTHER PUBLICATIONS

HWANG et al., *RAID-x: A New Distributed Disk Array for I/O-Centric Cluster Computing*, Proceedings of the 9th IEEE International Symposium on High Performance Distributed Computing (HPDC '00), Aug. 2000, pp. 279-286, IEEE, USA.

International Search Report & Written Opinion, PCT/US2015/018169, dated May 15, 2015, 10 pages.

International Search Report & Written Opinion, PCT/US2015/034302, dated Sep. 11, 2015, 10 pages.

International Search Report, PCT/US2015/034291, dated Sep. 30, 2015, 3 pages.

International Search Report, PCT/US2015/044370, dated Dec. 15, 2015, 3 pages.

International Search Report, PCT/US2015/014604, dated Jul. 2, 2015, 6 pages.

Paul Sweere, *Creating Storage Class Persistent Memory with NVDIMM*, Published in Aug. 2013, Flash Memory Summit 2013, <http://ww.flashmemorysummit.com/English/Collaterals/Proceedings/2013/20130814_T2_Sweere.pdf>, 22 pages.

PCMag. "Storage Array Definition". Published May 10, 2013. <http://web.archive.org/web/20130510121646/http://www.pcmag.com/encyclopedia/term/52091/storage-array>, 2 pages.

Google Search of "storage array define" performed by the Examiner on Nov. 4, 2015 for U.S. Appl. No. 14/725,278, Results limited to entries dated before 2012, 1 page.

Techopedia. "What is a disk array". Published Jan. 13, 2012. <http://web.archive.org/web/20120113053358/http://www.techopedia.com/definition/1009/disk-array>, 1 page.

Webopedia. "What is a disk array". Published May 26, 2011. <http://web/archive.org/web/20110526081214/http://www.webopedia.com/TERM/D/disk_array.html>, 2 pages.

Li et al., *Access Control for the Service Oriented Architecture*, Proceedings of the 2007 ACM Workshop on Secure Web Services (SWS '07), Nov. 2007, pp. 9-17, ACM New York, NY.

The International Search Report and the Written Opinion received from the International Searching Authority (ISA/EPO) for International Application No. PCT/US2016/015006, dated Apr. 29, 2016, 12 pages.

The International Search Report and the Written Opinion received from the International Searching Authority (ISA/EPO) for International Application No. PCT/US2016/015008, dated May 4, 2016, 12 pages.

C. Hota et al., *Capability-based Cryptographic Data Access Control in Cloud Computing*, Int. J. Advanced Networking and Applications, Column 1, Issue 1, dated Aug. 2011, 10 pages.

The International Search Report and the Written Opinion recieved from the International Searching Authority (ISA/EPO) for International Application No. PCT/US2016/020410, dated Jul. 8, 2016, 17 pages.

The International Search Report and the Written Opinion received from the International Searching Authority (ISA/EPO) for International Application No. PCT/US2016/032084, dated Jul. 18, 2016, 12 pages.

Faith, "dictzip file format", GitHub.com (online). [Accessed Jul. 28, 2015], 1 page, URL: https://github.com/fidlej/idzip.

Wikipedia, "Convergent Encryption", Wikipedia.org (online), accessed Sep. 8, 2015, 2 pages, URL: en.wikipedia.org/wiki/Convergent_encryption.

Storer et al., "Secure Data Deduplication", Proceedings of the 4th ACM International Workshop on Storage Security and Survivability (StorageSS'08), Oct. 2008, 10 pages, ACM New York, NY. USA. DOI: 10.1145/1456469.1456471.

The International Search Report and the Written Opinion received from the International Searching Authority (ISA/EPO) for International Application No. PCT/US2016/016333, dated Jun. 8, 2016, 12 pages.

ETSI, *Network function Virtualisation (NFV); Resiliency Requirements*, ETSI GS NFCV-REL 001, V1.1.1, http://www.etsi.org/deliver/etsi_gs/NFV-REL/001_099/001/01.01.01_60/gs_NFV-REL001v010101p.pdf (online), dated Jan. 2015, 82 pages.

The International Search Report and the Written Opinion received from the International Searching Authority (ISA/EPO) for International Application No. PCT/US2016/032052, dated Aug. 30, 2016, 17 pages.

Microsoft, "Hybrid for SharePoint Server 2013—Security Reference Architecture", <http://hybrid.office.com/img/Security_Reference_Architecture.pdf> (online), dated Oct. 2014, 53 pages.

Microsoft, "Hybrid Identity", <http://aka.ms/HybridIdentityWp> (online), dated Apr. 2014, 36 pages.

Microsoft, "Hybrid Identity Management", <http://download.microsoft.com/download/E/A/E/EAE57CD1-A80B-423C-96BB-142FAAC630B9/Hybrid_Identity_Datasheet.pdf> (online), published Apr. 2014, 17 pages.

Jacob Bellamy-McIntyre et al., "OpenID and the Enterprise: A Model-based Analysis of Single Sign-On Authentication", 2011 15th IEEE International Enterprise Distributed Object Computing Conference (EDOC), DOI: 10.1109/EDOC.2011.26, ISBN: 978-1-4577-0362-1, <https://www.cs.auckland.ac.nz/~lutteroth/publications/McIntryeLutterothWeber2011-OpenID.pdf> (online), dated Aug. 29, 2011, 10 pages.

The International Search Report and the Written Opinion received from the International Searching Authority (ISA/EPO) for International Application No. PCT/US2016/035492, dated Aug. 17, 2016, 10 pages.

Hu et al., *Container Marking: Combining Data Placement, Garbage Collection and Wear Levelling for Flash*, 19th Annual IEEE International Symposium on Modelling, Analysis, and Simulation of Computer and Telecommunications Systems, Jul. 25-27, 2011, 11 pages, ISBN: 978-0-7695-4430-4, DOI: 10.1109/MASCOTS.2011.50.

International Search Report and Written Opinion, PCT/US2016/036693, dated Aug. 29, 2016, 10 pages.

International Search Report and Written Opinion, PCT/US2016/038758, dated Oct. 7, 2016, 10 pages.

International Search Report and Written Opinion, PCT/US2016/040393, dated Sep. 22, 2016, 10 pages.

International Search Report and Written Opinion, PCT/US2016/044020, dated Aug. 30, 2016, 11 pages.

International Search Report and Written Opinion, PCT/US2016/044874, dated Oct. 7, 2016, 11 pages.

International Search Report and Written Opinion, PCT/US2016/044875, dated Oct. 5, 2016, 13 pages.

International Search Report and Written Opinion, PCT/US2016/044876, dated Oct. 21, 2016, 12 pages.

International Search Report and Written Opinion, PCT/US2016/044877, dated Sep. 29, 2016, 13 pages.

\* cited by examiner

INDEPENDENT SCALING OF COMPUTE RESOURCES AND STORAGE RESOURCES IN A STORAGE SYSTEM

DESCRIPTION OF EMBODIMENTS

Figure 1:
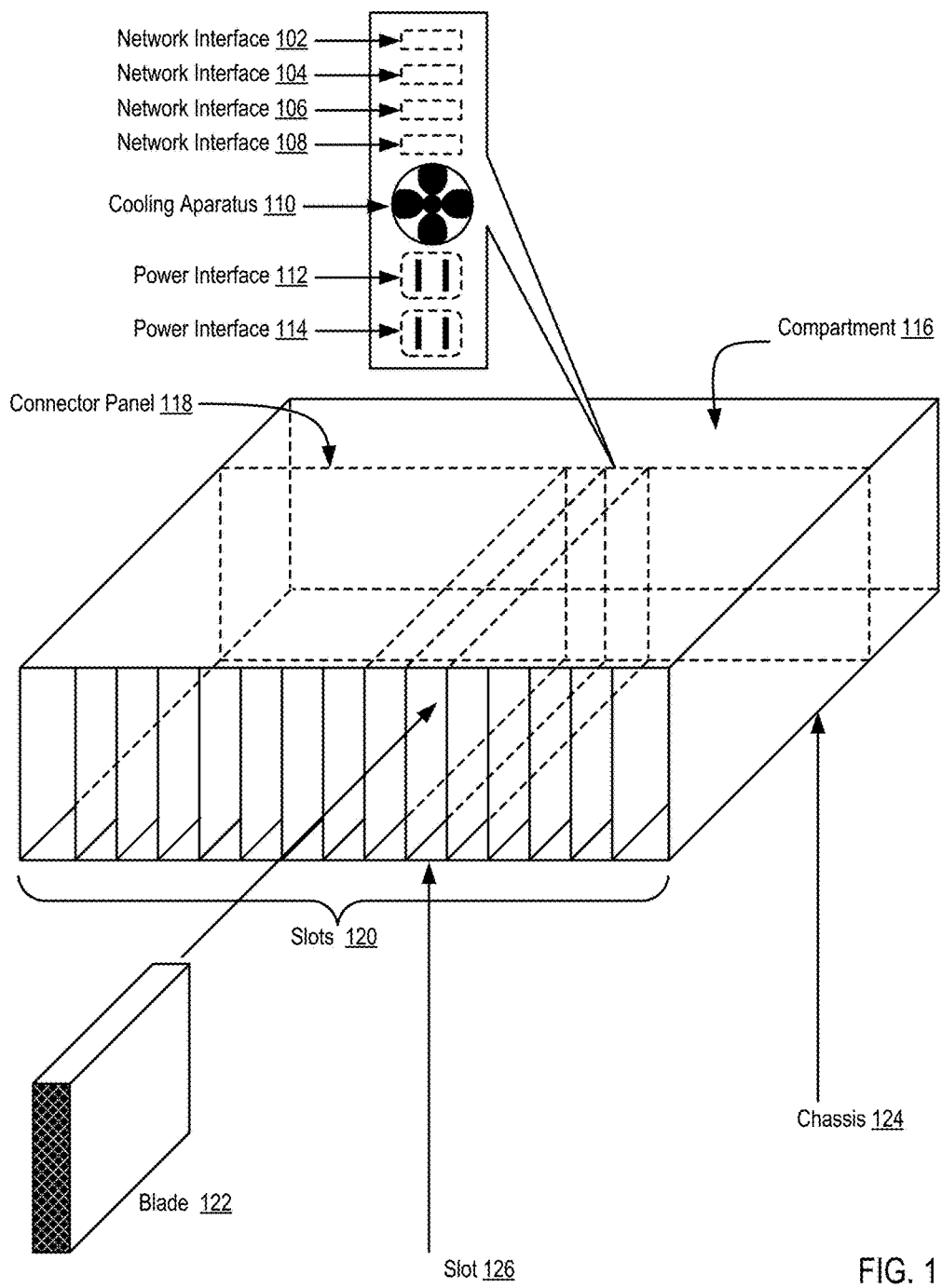
FIG. 1 sets forth a diagram of a chassis for use in a storage system that supports independent scaling of compute resources and storage resources according to embodiments of the present disclosure.

The present disclosure relates to independent scaling of compute resources and storage resources in a storage system. Storage systems described herein may include a plurality of blades. Each of the blades in the storage system may be embodied, for example, as a computing device that includes one or more computer processors, dynamic random access memory ('DRAM'), flash memory, interfaces for one more communication busses, interfaces for one or more power distribution busses, cooling components, and so on. Although the blades will be described in more detail below, readers will appreciate that the blades may be embodied as different types of blades, such that the collective set of blades include heterogeneous members.

Each of the blades in the storage system may be mounted within one of a plurality of chassis. Each chassis may be embodied, for example, as physical structure that helps protect and organize components within the storage system. Each chassis may include a plurality of slots, where each slot is configured to receive a blade. Each chassis may also include one or more mechanisms such as a power distribution bus that is utilized to provide power to each blade that is mounted within the chassis, one or more data communication mechanisms such as a data communication bus that enables communication between each blade that is mounted within the chassis, one or more data communication mechanisms such as a data communication bus that enables communication between each blade that is mounted within and an external data communications network, and so on. In fact, each chassis may include at least two instances of both the power distribution mechanism and the communication mechanisms, where each instance of the power distribution mechanism and each instance of the communication mechanisms may be enabled or disabled independently.

As mentioned above, the present disclosure relates to independent scaling of compute resources and storage resources. Compute resources may be scaled independently of storage resources, for example, by altering the amount of compute resources that are provided by the storage system without changing the amount of storage resources that are provided by the storage system or by changing the amount of storage resources that are provided by the storage system without changing the amount of compute resources that are provided by the storage system. Compute resources and storage resources may be independently scaled, for example, by adding blades that only include storage resources, by adding blades that only include compute resources, by enabling compute resources on a blade to be powered up or powered down with no impact to the storage resources in the storage system, by enabling storage resources on a blade to be powered up or powered down with no impact to the compute resources in the storage system, and so on. As such, embodiments of the present disclosure will be described that include hardware support for independent scaling of compute resources and storage resources, software support for independent scaling of compute resources and storage resources, or any combination thereof.

Example apparatuses and storage systems that support independent scaling of compute resources and storage resources in accordance with the present disclosure are described with reference to the accompanying drawings, beginning with FIG. 1. FIG. 1 sets forth a diagram of a chassis (124) for use in a storage system that supports independent scaling of compute resources and storage resources. The chassis (124) depicted in FIG. 1 may be embodied, for example, as an enclosure that may be mounted within a larger enclosure (e.g., a rack) to form a multi-chassis storage system. The chassis (124) depicted in FIG. 1 may include a plurality of slots (120) where each slot is configured to receive a blade (122). Although not depicted in the example of FIG. 1, readers will appreciate that each slot may include various support structures such as rails, locking mechanisms, and other physical components for securing a blade (122) within a particular slot. Furthermore, in alternative embodiments, a single blade may span multiple slots.

The blade (122) depicted in FIG. 1 may be embodied, for example, as a computing device that includes one or more computer processors, dynamic random access memory ('DRAM'), flash memory, interfaces for one more communication busses, interfaces for one or more power distribution busses, cooling components, and so on. Although blades will be described in more detail below, readers will appreciate that the chassis (124) may be configured to support different types of blades, such that the collective set of blades may include heterogeneous members. Blades may be of different types as some blades may only provide processing resources to the overall storage system, some blades may only provide storage resources to the overall storage system, and some blades may provide both processing resources and storage resources to the overall storage system. Furthermore, even the blades that are identical in type may be different in terms of the amount of storage resources that the blades provide to the overall storage system. For example, a first blade that only provides storage resources to the overall storage system may provide 8 TB of storage while a second blade that only provides storage resources to the overall storage system may provide 256 TB of storage. The blades that are identical in type may also be different in terms of the amount of processing resources that the blades provide to the overall storage system. For example, a first blade that only provides processing resources to the overall storage system may include more processors or more powerful processors than a second blade that only provides processing resources to the overall storage system. Readers will appreciate that other differences may also exist between two individual blades and that blade uniformity is not required according to embodiments described herein.

The chassis (124) depicted in FIG. 1 may also include a compartment (116) that is used to house computing devices and computing components that are utilized by the blades that are mounted within the chassis (124). The compartment (116) may include, for example, one or more power supplies that are used to provide power to one or more blades mounted within the chassis (124), one or more power busses that are used to deliver power from one or more power supplies to one or more blades mounted within the chassis (124), one or more network switches that are used to route data communications between blades mounted within the chassis (124), one or more network switches that are used to route data communications between blades mounted within the chassis (124) and a data communications network that is external to the chassis (124), one or more data communications busses, and so on. Readers will appreciate that additional computing devices and computing components may be mounted within the compartment (116) according to embodiments of the present disclosure.

The chassis (124) depicted in FIG. 1 may also include a connector panel (118) that is used to support various interfaces and connectors that allow components within the blades that are mounted within the chassis (124) to couple to computing devices and computing components that are housed in the compartment (116). The connector panel (118) may be used to provide various interfaces and connectors to each blade (122), as each slot may have a unique set of interfaces and connectors mounted on the connector panel (118), such that a blade that is mounted within a particular slot may couple to the unique set of interfaces and connectors mounted on the connector panel (118) when the blade is inserted into the particular slot. In the example depicted in FIG. 1, four network interfaces (102, 104, 106, 108) are mounted on the connector panel (118) for use by the blade (122) depicted in FIG. 1 when the blade (122) is inserted into a slot (126). The four network interfaces (102, 104, 106, 108) may be embodied, for example, as an RJ45 connector that is coupled to an Ethernet cable and inserted into an Ethernet port on the blade (122), as a 9-pin DE-9 cable connector that is coupled to an optical fiber cable and inserted into a Fibre Channel port on the blade (122), as a cooper or optical Quad Small Form-factor Pluggable ('QSFP') for Ethernet, InfiniBand, or other high speed signaling interface, as other interfaces that enable an Ethernet adapter in the blade (122) to be coupled to a data communications network, as other interfaces that enable a Fibre Channel adapter in the blade (122) to be coupled to a data communications network, as other interfaces that enable other types of host bus adapters in the blade (122) to be coupled to a data communications network, and so on. Readers will appreciate that each of the four network interfaces (102, 104, 106, 108) may be used to couple the blade (122) to distinct data communications networks, two or more of the network interfaces (102, 104, 106, 108) may be used to couple the blade (122) to the same data communications networks, one or more of the network interfaces (102, 104, 106, 108) may be used to couple the blade (122) to other blades or computing devices for point-to-point communications with the blade (122), and so on.

In the example depicted in FIG. 1, two power interfaces are also mounted on the connector panel (118) for use by the blade (122) depicted in FIG. 1 when the blade (122) is inserted into a slot (126). The power interfaces (112, 114) may be embodied, for example, as an interface to a power bus that is coupled to a power supply for delivering power to one or more of the blades in the chassis (124). Readers will appreciate that each power interface (112, 114) may be coupled to an independently controlled power domain, such that enabling or disabling the delivery of power to the blade (122) via the first power interface (112) has no impact on the delivery of power to the blade (122) via the second power interface (114), and vice versa. Readers will appreciate that some components within the blade (122) may be configured to receive power via the first power interface (112) while other components within the blade (122) may be configured to receive power via the second power interface (114), so that the delivery of power to different components within the blade (122) may be independently controlled. For example, compute resources within the blade (122) may receive power via the first power interface (112) while storage resources within the blade (122) may receive power via the second power interface (114).

In the example depicted in FIG. 1, a cooling apparatus (110) is also mounted on the connector panel (118). The cooling apparatus (110) may be embodied, for example, as a fan that is configured to deliver air flow to the blade (122) when the blade is inserted into the slot (126). Readers will appreciate that the connector panel (118) may include other interfaces not depicted here, different numbers of interfaces than are depicted here, and so on. Readers will further appreciate that while a connector panel (118) is one possible way to enable the blades that are mounted within the chassis (124) to couple to computing devices and computing components that are housed in the compartment (116), chassis for use in storage systems according to embodiments of the present disclosure can utilize other mechanisms to enable the blades that are mounted within the chassis (124) to couple to computing devices and computing components that are housed in the compartment (116). Furthermore, such computing devices and computing components do not have to be contained within a distinct compartment (116), as chassis (124) for use in storage systems according to embodiments of the present disclosure may be embodied in other ways.

Figure 2:
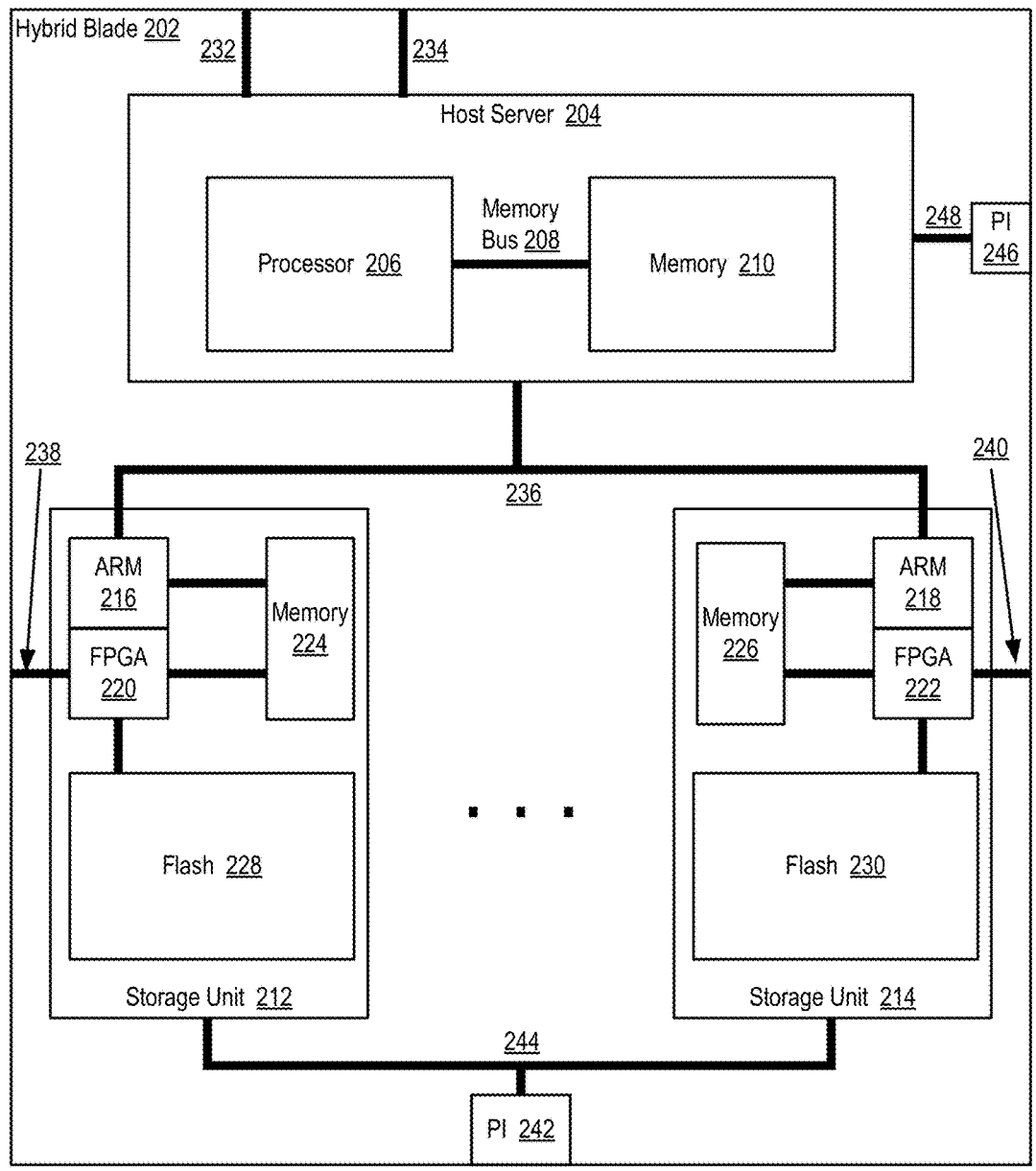
FIG. 2 sets forth a diagram of a hybrid blade useful in storage systems that support independent scaling of compute resources and storage resources according to embodiments of the present disclosure.

For further explanation, FIG. 2 sets forth a diagram of a hybrid blade (202) useful in storage systems that support independent scaling of compute resources and storage resources according to embodiments of the present disclosure. The hybrid blade (202) depicted in FIG. 2 is referred to as a 'hybrid' blade because the hybrid blade (202) includes both compute resources and storage resources.

The compute resources in the hybrid blade (202) depicted in FIG. 2 includes a host server (204) that contains a computer processor (206) coupled to memory (210) via a memory bus (208). The computer processor (206) depicted in FIG. 2 may be embodied, for example, as a central processing unit ('CPU') or other form of electronic circuitry configured to execute computer program instructions. The computer processor (206) may utilize the memory (210) to store data or other information useful during the execution of computer program instructions by the computer processor (206). Such memory (210) may be embodied, for example, as DRAM that is utilized by the computer processor (206) to store information when the computer processor (206) is performing computational tasks such as creating and sending I/O operations to one of the storage units (212, 214), breaking up data, reassembling data, and other tasks. In the example depicted in FIG. 2, the host server (204) can represent compute resources that the hybrid blade (202) may offer for use by entities executing on a storage system that includes the hybrid blade (202). For example, one or more authorities (which will be described in greater detail below) that are executing on the storage system may execute on the host server (204).

In the example depicted in FIG. 2, the host server (204) is coupled to two data communication links (232, 234). Such data communications links (232, 234) may be embodied, for example, as Ethernet links, such that the host server (204) can be coupled to a data communication network via a network adapter (not shown) contained in the host server (204). Through the use of such data communications links (232, 234), the host server (204) may receive input/output operations that are directed to the attached storage units (212, 214), such as requests to read data from the attached storage units (212, 214) or requests to write data to the attached storage units (212, 214), from other blades in a storage system that includes the hybrid blade (202).

The hybrid blade (202) depicted in FIG. 2 also includes storage resources in the form of one or more storage units (212, 214). Each storage unit (212, 214) may include flash (228, 230) memory as well as other forms of memory (224, 226), such as non-volatile random access memory ('NVRAM') which will be discussed in greater detail below. In the example depicted in FIG. 2, each storage unit (212, 214) can represent storage resources that the hybrid blade (202) may offer for use by users of a storage system that includes the hybrid blade (202). In the example depicted in FIG. 2, the storage units (212, 214) may include integrated circuits such as a field-programmable gate array ('FPGA') (220, 222), microprocessors such as an Advanced RISC Machine ('ARM') microprocessor that are utilized to write data to and read data from the flash (228, 230) memory as well as the other forms of memory (224, 226) in the storage unit (212, 214), or any other form of computer processor. The FPGAs (220, 222) and the ARM (216, 218) microprocessors may, in some embodiments, perform operations other than strict memory accesses. For example, in some embodiments the FPGAs (220, 222) and the ARM (216, 218) microprocessors may break up data, reassemble data, and so on. In the example depicted in FIG. 2, the computer processor (206) may access the storage units (212, 214) via a data communication bus (236) such as a Peripheral Component Interconnect Express ('PCIe') bus. In the example depicted in FIG. 2, the data communication bus (236), ARM (216, 218) microprocessors, and FPGAs (220, 222) form a local access interface through which the local compute resources (e.g., the host server (204)) can access the local storage resources (e.g., the flash memory (228, 230) and other forms of memory (224, 226)).

In the example depicted in FIG. 2, the hybrid blade (202) also includes data communications links (238, 240) that may be used to communicatively couple one or more of the storage units (212, 214) to other blades in the storage system. The data communications links (238, 240) may be embodied, for example, as an Ethernet link that enables an FPGA (220, 222) in the storage unit (212, 214) to couple to a data communications network. The data communications links (238, 240) and the FPGAs (220, 222) may collectively form a remote access interface through which compute resources on a remote blade can access the local storage resources (e.g., the flash memory (228, 230) and other forms of memory (224, 226)) without utilizing the local compute resources (e.g., the host server (204)). In such an example, compute resources on a remote blade may send an instruction to write data to, or read data from, the local storage resources directly to the FPGA (220, 222) in the storage unit (212, 214) via the data communications links (238, 240). In such a way, compute resources on a remote blade can directly access local storage resources on the hybrid blade (202) without needing to route such an access request through the local compute resources on the hybrid blade (202).

Although in some embodiments the remote access interface may be embodied as an Ethernet interface and the local access interface may be embodied as a PCIe interface, readers will appreciate that hybrid blades (202) according to embodiments of the present disclosure may utilize other types of interfaces for the remote access interface and the local access interface. In some embodiments the remote access interface and the local access interface may be implemented using the same technologies, in other embodiments the remote access interface and the local access interface may be implemented using other technologies, and so on.

In the example depicted in FIG. 2, the hybrid blade (202) also includes a power interface (246) and a power distribution bus (248) through which power can be provided to the host server (204). The power interface (246) may be coupled, for example, to a first power supply, to a first power bus that is external to the hybrid blade (202) and provided by the chassis that the blade is mounted within, and so on. Readers will appreciate that the power interface (246) and the power distribution bus (248) may collectively form a first local power domain that is configured to deliver power to the local compute resources (e.g., the host server (204)).

In the example depicted in FIG. 2, the hybrid blade (202) also includes a power interface (242) and a power distribution bus (244) through which power can be provided to one or more of the storage units (212, 214). The power interface (242) may be coupled, for example, to a second power supply, to a second power bus that is external to the hybrid blade (202) and provided by the chassis that the blade is mounted within, and so on. Readers will appreciate that the power interface (242) and the power distribution bus (244) may collectively form a second local power domain that is configured to deliver power to the local storage resources (e.g., the storage units (212, 214). In the example depicted in FIG. 2, the first local power domain and the second local power domain can be independently operated as the power interfaces (242, 246) may be enabled or disabled independently, the distinct power supplies that are coupled to the power interfaces (242, 246) may be enabled or disabled independently, the distinct power busses that are coupled to the power interfaces (242, 246) may be enabled or disabled independently, and so on. In such a way, the delivery of power to the host server (204) may be enabled or disabled independently of the delivery of power to one or more of the storage units (212, 214), and vice versa.

Readers will appreciate that in the example depicted in FIG. 2, the second local power domain described in the preceding paragraph can also include a remote access interface such as the data communications links (238, 240). As described above, the data communications links (238, 240) may be embodied as an Ethernet link that enables an FPGA (220, 222) in the storage unit (212, 214) to couple to a data communications network. Power may therefore be delivered to the local storage resources (e.g., the storage units (212, 214)) via the data communications links (238, 240), for example, through the use of Power over Ethernet ('PoE') techniques. In such a way, when a remote blade is accessing the local storage resources via the remote access interface, the storage units (212, 214) may be powered using remote access interface, whereas the storage units (212, 214) may be powered using the power interfaces (242, 246) and the power distribution bus (244) when the local compute resources are accessing the local storage resources. In alternative embodiments, power may be provided to the storage units (212, 214) in different ways, so long as the delivery of power to the host server (204) may be enabled or disabled independently of the delivery of power to one or more of the storage units (212, 214), and vice versa.

The preceding paragraphs describe non-limiting, example embodiments of a first local power domain and a second local power domain. In alternative embodiments, the first local power domain and the second local power domain may include fewer or additional components. The first local power domain and the second local power domain may also be configured to deliver power to components within the hybrid blade (202) in coordination with components that are external to the hybrid blade (202) such as, for example, external power supplies, external power busses, external data communications networks, and so on. The first local power domain and the second local power domain may also be coupled to receive power from the same power source (e.g., the same power supply), so long as the delivery of power to the host server (204) may be enabled or disabled independently of the delivery of power to one or more of the storage units (212, 214), and vice versa. In an embodiment where the first local power domain and the second local power domain may receive power from the same power source, the delivery of power to the host server (204) may be enabled or disabled independently of the delivery of power to one or more of the storage units (212, 214), and vice versa, through the use of a switching mechanism, power delivery network, or other mechanism that enables the delivery of power to each power domain to be blocked or enabled independently. Readers will appreciate that additional embodiments are possible that are consistent with the spirit of the present disclosure.

Readers will appreciate that other types of blades may also exist. For example, a compute blade may be similar to the hybrid blade (202) depicted in FIG. 2 as the compute blade may include one or more host servers that are similar to the host server (204) depicted in FIG. 2. Such a compute blade may be different than the hybrid blade (202) depicted in FIG. 2, however, as the compute blade may lack the storage units (212, 214) depicted in FIG. 2. Readers will further appreciate that a storage blade may be similar to the hybrid blade (202) depicted in FIG. 2 as the storage blade may include one or more storage units that are similar to the storage units (212, 214) depicted in FIG. 2. Such a storage blade may be different than the hybrid blade (202) depicted in FIG. 2, however, as the storage blade may lack the host server (204) depicted in FIG. 2. The example blade (202) depicted in FIG. 2 is included only for explanatory purposes. In other embodiments, the blades may include additional processors, additional storage units, compute resources that are packaged in a different manner, storage resources that are packaged in a different manner, and so on.

Figure 3:
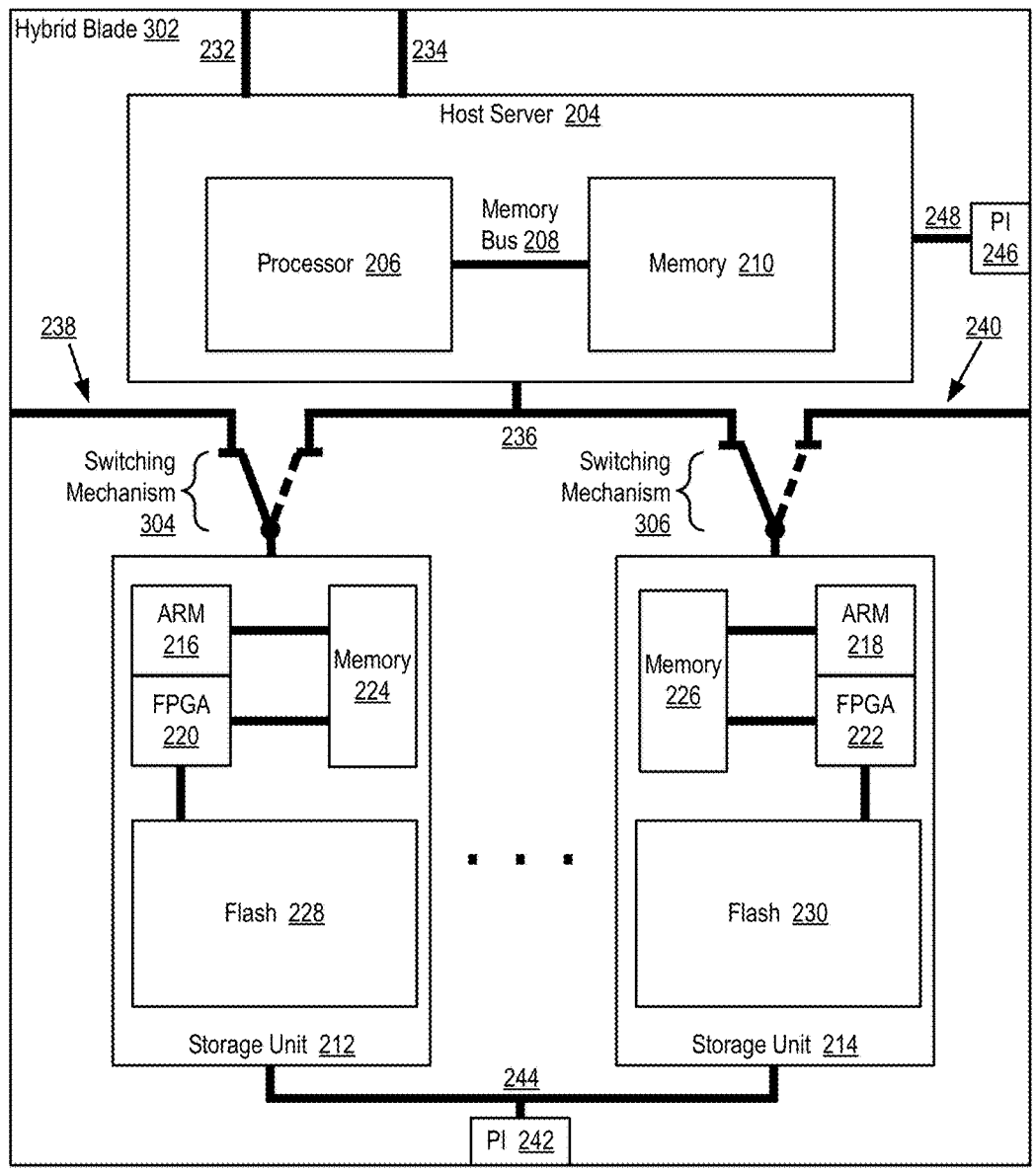
FIG. 3 sets forth a diagram of an additional hybrid blade useful in storage systems that support independent scaling of compute resources and storage resources according to embodiments of the present disclosure.

For further explanation, FIG. 3 sets forth a diagram of an additional hybrid blade (302) useful in storage systems that support independent scaling of compute resources and storage resources according to embodiments of the present disclosure. The hybrid blade (302) depicted in FIG. 3 is similar to the hybrid blade (202) depicted in FIG. 2, as the hybrid blade (302) depicted in FIG. 3 also includes local storage resources such as the storage units (212, 214), local compute resources such as the host server (204), a local access interface through which the local compute resources can access the local storage resources, a remote access interface through which compute resources on a remote blade can access the local storage resources without utilizing the local compute resources, a first local power domain configured to deliver power to the local compute resources, and a second local power domain configured to deliver power to the local storage resources, where the first local power domain and the second local power domain can be independently operated.

The hybrid blade (302) depicted in FIG. 3 also includes a switching mechanism (304, 306) that is configured to provide access to local storage resources such as the storage units (212, 214). Each switching mechanism (304, 306) may be configured to couple to the local compute resources via a first interface and further configured to couple to remote compute resources via a second interface. The first switching mechanism (304), for example, may be coupled to local compute resources in the form of a host server (204) via a first interface such as the local access interface and also coupled to remote compute resources in the form of a host server on a remote blade (not shown) via a second interface such as the remote access interface that includes the data communications link (238). The second switching mechanism (306) may be coupled to local compute resources in the form of a host server (204) via a first interface such as the local access interface and also coupled to remote compute resources in the form of a host server on a remote blade (not shown) via a second interface such as the remote access interface that includes the data communications link (240). In the specific example illustrated in FIG. 3, the first switching mechanism (304) is coupled to the remote access interface that includes the data communications link (238), such that the storage unit (212) may be accessed by a host server on a remote blade without utilizing the local compute resources in the hybrid blade (302). The second switching mechanism (306), however, is coupled to the local access interface, such that the storage unit (214) may be accessed by the local compute resources in the hybrid blade (302). In such an example, however, the dashed lines in the switching mechanisms (304, 306) are used to illustrate that each switching mechanism (304, 306) may be reconfigured to couple the storage units (212, 214) to a different data communications pathway. In the example depicted in FIG. 3, each switching mechanism (304, 306) may be embodied as a mechanical device that can facilitate a data communications connection between a particular storage unit (212, 214) and a plurality of data communications pathways, although at any particular time each switching mechanism (304, 306) may only facilitate data communications between the particular storage unit (212, 214) and a single data communications pathway.

Figure 4:
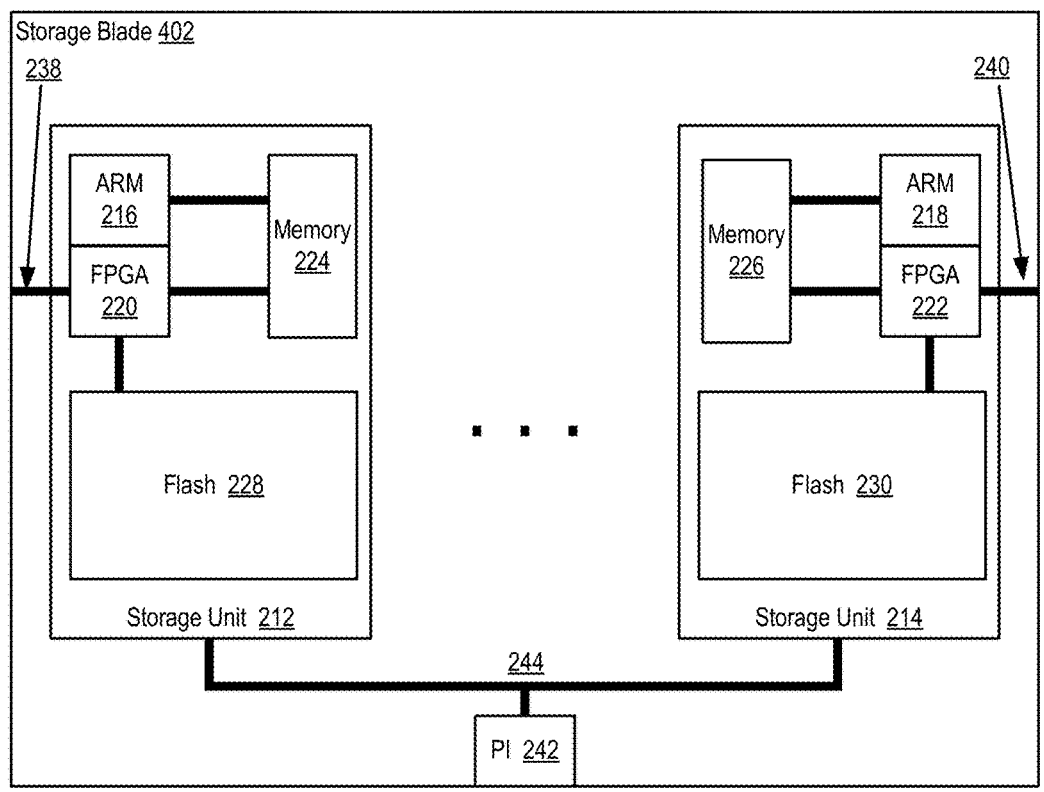
FIG. 4 sets forth a diagram of a storage blade useful in storage systems that support independent scaling of compute resources and storage resources according to embodiments of the present disclosure.

For further explanation, FIG. 4 sets forth a diagram of a storage blade (402) useful in storage systems that support independent scaling of compute resources and storage resources according to embodiments of the present disclosure. The storage blade (402) depicted in FIG. 4 is similar to the hybrid blade described above with reference to FIG. 2 and FIG. 3, although the storage blade (402) is different than the hybrid blades described above as the storage blade (402) does not include any local compute resources that are available for use by a storage system that the storage blade (402) is included within.

The storage blade (402) depicted in FIG. 4 includes storage resources in the form of one or more storage units (212, 214). Each storage unit (212, 214) may include flash (228, 230) memory as well as other forms of memory (224, 226), such as 'NVRAM, which will be discussed in greater detail below. In the example depicted in FIG. 4, each storage unit (212, 214) can represent storage resources that the storage blade (402) may offer for use by users of a storage system that includes the storage blade (402).

In the example depicted in FIG. 4, the storage units (212, 214) may include integrated circuits such as an FPGA (220, 222), microprocessors such as an ARM microprocessor that are utilized to write data to and read data from the flash (228, 230) memory as well as the other forms of memory (224, 226) in the storage unit (212, 214), or any other form of computer processor. The FPGAs (220, 222) and the ARM (216, 218) microprocessors may, in some embodiments, perform operations other than strict memory accesses. For example, in some embodiments the FPGAs (220, 222) and the ARM (216, 218) microprocessors may break up data, reassemble data, and so on.

In the example depicted in FIG. 4, the storage blade (402) also includes data communications links (238, 240) that may be used to couple one or more of the storage units (212, 214) to other blades in the storage system. The data communications links (238, 240) may be embodied, for example, as an Ethernet link that enables an FPGA (220, 222) in the storage unit (212, 214) to couple to a data communications network. The data communications links (238, 240) and the FPGAs (220, 222) may collectively form a remote access interface through which compute resources on a remote blade can access the local storage resources (e.g., the flash memory (228, 230) and other forms of memory (224, 226)) without utilizing any local compute resources on the storage blade (402). In such an example, compute resources on a remote blade may send an instruction to write data to, or read data from, the local storage resources directly to the FPGA (220, 222) in the storage unit (212, 214) via the data communications links (238, 240). In such a way, compute resources on a remote blade can directly access local storage resources on the hybrid blade (202) without needing to route such an access request through local compute resources on the storage blade (402).

In the example depicted in FIG. 4, the storage blade (402) also includes a power interface (242) and a power distribution bus (244) through which power can be provided to one or more of the storage units (212, 214). The power interface (242) may be coupled, for example, to a power supply, to a power bus that is external to the hybrid blade (202) and provided by the chassis that the blade is mounted within, and so on. Readers will appreciate that the power interface (242) and the power distribution bus (244) may collectively form a local power domain configured to deliver power to the local storage resources (e.g., the storage units (212, 214). Readers will appreciate that in the example depicted in FIG. 4, the local power domain can also include a remote access interface such as the data communications links (238, 240). As described above, the data communications links (238, 240) may be embodied as an Ethernet link that enables an FPGA (220, 222) in the storage unit (212, 214) to couple to a data communications network. Power may therefore be delivered to the local storage resources (e.g., the storage units (212, 214)) via the data communications links (238, 240), for example, through the use of PoE techniques. In such a way, power may be delivered to the storage units (212, 214) via the remote access interface, via the power interface (242) and power distribution bus (244), or any combination thereof.

Figure 5:
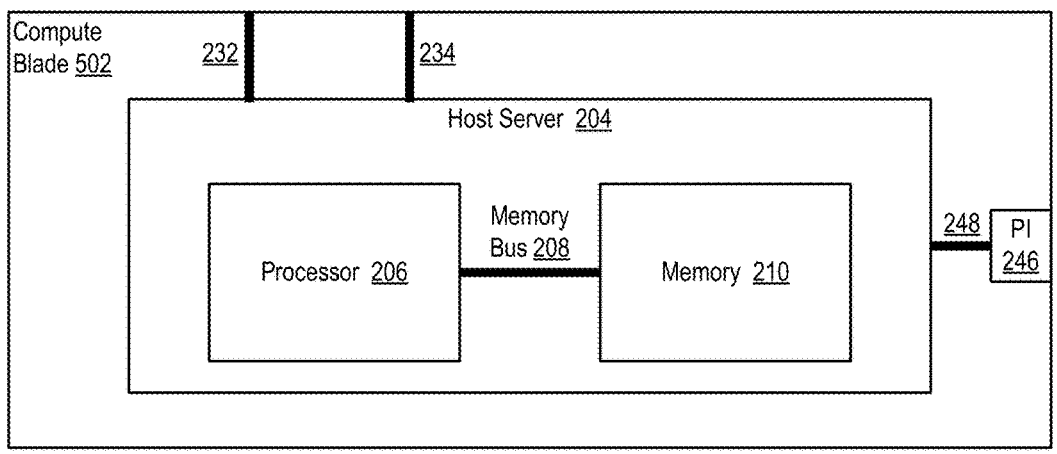
FIG. 5 sets forth a diagram of a compute blade useful in storage systems that support independent scaling of compute resources and storage resources according to embodiments of the present disclosure.

For further explanation, FIG. 5 sets forth a diagram of a compute blade (502) useful in storage systems that support independent scaling of compute resources and storage resources according to embodiments of the present disclosure. The compute blade (502) depicted in FIG. 5 is similar to the hybrid blade described above with reference to FIG. 2 and FIG. 3, although the compute blade (502) is different than the hybrid blades described above as the compute blade (502) does not include any local storage resources that may be used that are available for use by a storage system that the compute blade (502) is included within.

The compute resources in the compute blade (502) depicted in FIG. 5 includes a host server (204) that contains a computer processor (206) coupled to memory (210) via a memory bus (208). The computer processor (206) depicted in FIG. 5 may be embodied, for example, as a CPU or other form of electronic circuitry configured to execute computer program instructions. The computer processor (206) may utilize the memory (210) to store data or other information useful during the execution of computer program instructions by the computer processor (206). Such memory (210) may be embodied, for example, as DRAM that is utilized by the computer processor (206) to store information when the computer processor (206) is performing computational tasks such as creating and sending I/O operations to one of the storage units (212, 214), breaking up data, reassembling data, and other tasks. In the example depicted in FIG. 5, the host server (204) can represent compute resources that the compute blade (502) may offer for use by entities executing on a storage system that includes the compute blade (502). For example, one or more authorities (which will be described in greater detail below) that are executing on the storage system may execute on the host server (204). In the example depicted in FIG. 5, the host server (204) is coupled to two data communication links (232, 234). Such data communications links (232, 234) may be embodied, for example, as Ethernet links, such that the host server (204) can be coupled to a data communication network via a network adapter (not shown) contained in the host server (204).

In the example depicted in FIG. 5, the compute blade (502) also includes a power interface (246) and a power distribution bus (248) through which power can be provided to the host server (204). The power interface (246) may be coupled, for example, to a power supply, to a power bus that is external to the compute blade (502) and provided by the chassis that the blade is mounted within, and so on. Readers will appreciate that the power interface (246) and the power distribution bus (248) may collectively form a local power domain that is configured to deliver power to the local compute resources (e.g., the host server (204)) in the compute blade (502).

Figure 6:
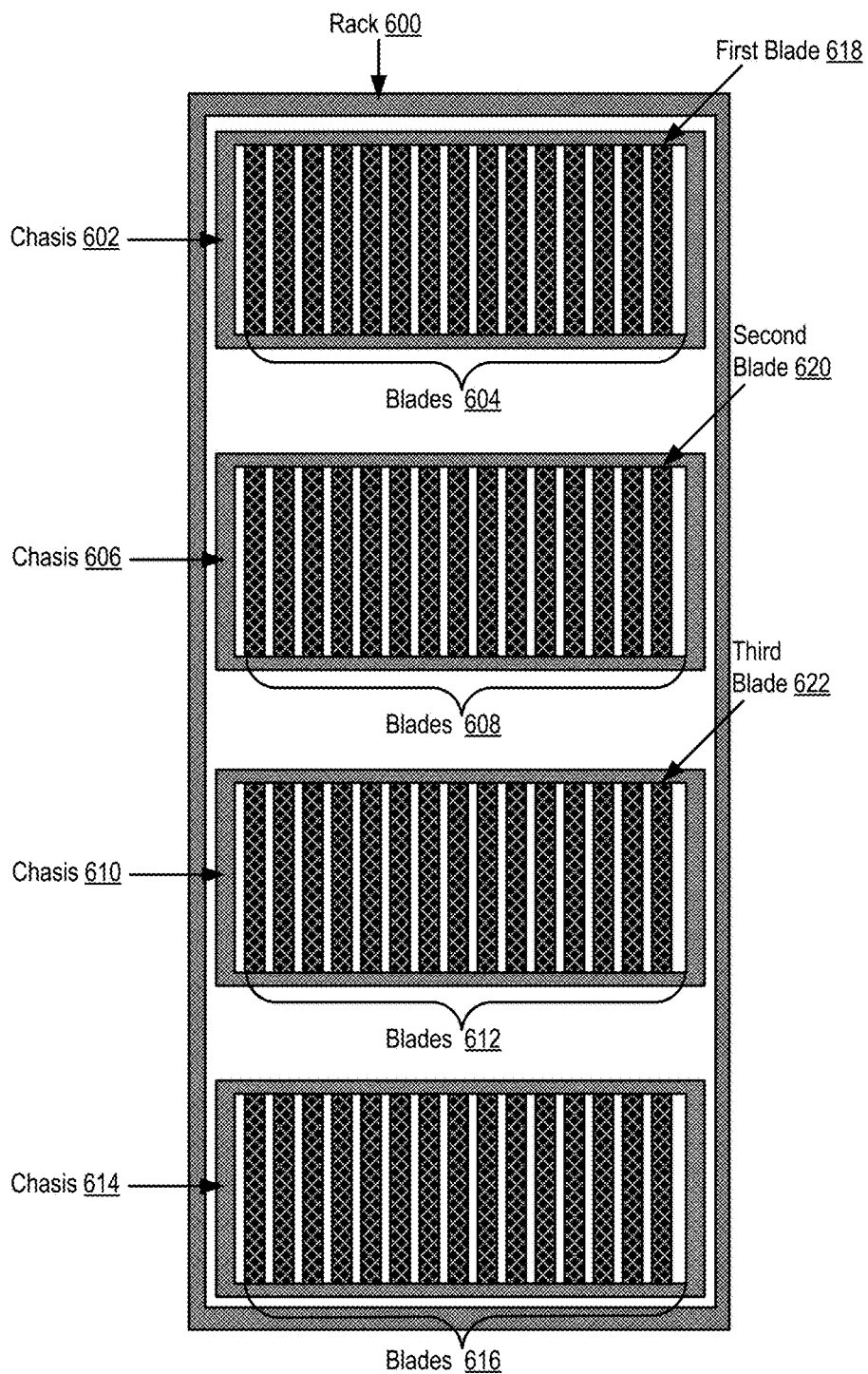
FIG. 6 sets forth a diagram of a storage system that supports independent scaling of compute resources and storage resources according to embodiments of the present disclosure.

For further explanation, FIG. 6 sets forth a diagram of a storage system that supports independent scaling of compute resources and storage resources according to embodiments of the present disclosure. The storage system of FIG. 6 includes a plurality of chassis (602, 606, 610, 614) mounted within a rack (600). The rack (600) depicted in FIG. 6 may be embodied as a standardized frame or enclosure for mounting multiple equipment modules, such as multiple chassis (602, 606, 610, 614). The rack (600) may be embodied, for example, as a 19-inch rack that includes edges or ears that protrude on each side, thereby enabling a chassis (602, 606, 610, 614) or other module to be fastened to the rack (600) with screws or some other form of fastener. Readers will appreciate that while the storage system depicted in FIG. 6 includes a plurality of chassis (602, 606, 610, 614) mounted within a single rack (600), in other embodiments the plurality of chassis (602, 606, 610, 614) may be distributed across multiple racks. For example, a first chassis in the storage system may be mounted within a first rack, a second chassis in the storage system may be mounted within a second rack, and so on.

Although depicted in less detail, each of the chassis (602, 606, 610, 614) depicted in FIG. 6 may be similar to the chassis described above with reference to FIG. 1, as the chassis (602, 606, 610, 614) include a plurality of slots, where each slot is configured to receive a blade. The chassis (602, 606, 610, 614) depicted in FIG. 6 may be embodied, for example, as passive elements that includes no logic. Each chassis (602, 606, 610, 614) may include a mechanism, such as a power distribution bus, that is utilized to provide power to each blade that is mounted within the chassis (602, 606, 610, 614). Each chassis (602, 606, 610, 614) may further include a communication mechanism, such as a communication bus, that enables communication between each blade that is mounted within the chassis (602, 606, 610, 614). The communication mechanism may be embodied, for example, as an Ethernet bus, a PCIe bus, InfiniBand bus, and so on. In some embodiments, each chassis (602, 606, 610, 614) may include at least two instances of both the power distribution mechanism and the communication mechanism, where each instance of the power distribution mechanism and each instance of the communication mechanism may be enabled or disabled independently.

Each chassis (602, 606, 610, 614) depicted in FIG. 6 may also include one or more ports for receiving an external communication bus that enables communication between multiple chassis (602, 606, 610, 614), directly or through a switch, as well as communications between a chassis (602, 606, 610, 614) and an external client system. The external communication bus may use a technology such as Ethernet, InfiniBand, Fibre Channel, and so on. In some embodiments, the external communication bus may use different communication bus technologies for inter-chassis communication than is used for communication with an external client system. In embodiments where one or more switches are deployed, each switch may act as a translation layer between multiple protocols or technologies. When multiple chassis (602, 606, 610, 614) are connected to define a storage cluster, the storage cluster may be accessed by a client using either proprietary interfaces or standard interfaces such a PCIe interface, a SAS interfaces, a SATA interface, or other interface using protocols such as network file system ('NFS'), common internet file system ('CIFS'), small computer system interface ('SCSI'), hypertext transfer protocol ('HTTP'), Object storage protocols, and so on. Translation from the client protocol may occur at the switch, external communication bus, or within each blade.

Each chassis (602, 606, 610, 614) depicted in FIG. 6 houses fifteen blades (604, 608, 612, 616), although in other embodiments each chassis (602, 606, 610, 614) may house more or fewer blades. Each of the blades (604, 608, 612, 616) depicted in FIG. 6 may be embodied, for example, as a computing device that includes one or more computer processors, DRAM, flash memory, interfaces for one more communication busses, interfaces for one or more power distribution busses, cooling components, and so on. Readers will appreciate that the blades (604, 608, 612, 616) depicted in FIG. 6 may be embodied as different types of blades, such that the collective set of blades (604, 608, 612, 616) include heterogeneous members. Blades may be of different types as some blades (604, 608, 612, 616) may only provide processing resources to the overall storage system, some blades (604, 608, 612, 616) may only provide storage resources to the overall storage system, and some blades (604, 608, 612, 616) may provide both processing resources and storage resources to the overall storage system. Furthermore, even the blades (604, 608, 612, 616) that are identical in type may be different in terms of the amount of storage resources that the blades (604, 608, 612, 616) provide to the overall storage system. For example, a first blade that only provides storage resources to the overall storage system may provide 8 TB of storage while a second blade that only provides storage resources to the overall storage system may provide 256 TB of storage. The blades (604, 608, 612, 616) that are identical in type may also be different in terms of the amount of processing resources that the blades (604, 608, 612, 616) provide to the overall storage system. For example, a first blade that only provides processing resources to the overall storage system may include more processors or more powerful processors than a second blade that only provides processing resources to the overall storage system. Readers will appreciate that other differences may also exist between two individual blades and that blade uniformity is not required according to embodiments described herein.

Although not explicitly depicted in FIG. 6, each chassis (602, 606, 610, 614) may include one or more modules, data communications busses, or other apparatus that is used to identify which type of blade is inserted into a particular slot of the chassis (602, 606, 610, 614). In such an example, a management module may be configured to request information from each blade in each chassis (602, 606, 610, 614) when each blade is powered on, when the blade is inserted into a chassis (602, 606, 610, 614), or at some other time. The information received by the management module can include, for example, a special purpose identifier maintained by the blade that identifies the type (e.g., storage blade, compute blade, hybrid blade) of blade that has been inserted into the chassis (602, 606, 610, 614). In an alternative embodiment, each blade (604, 608, 612, 616) may be configured to automatically provide such information to a management module as part of a registration process.

In the example depicted in FIG. 6, the storage system may be initially configured by a management module that is executing remotely. The management module may be executing, for example, in a network switch control processor. Readers will appreciate that such a management module may be executing on any remote CPU and may be coupled to the storage system via one or more data communication networks. Alternatively, the management module may be executing locally as the management module may be executing on one or more of the blades (604, 608, 612, 616) in the storage system.

The storage system depicted in FIG. 6 includes a first blade (618) mounted within one of the chassis (602) that includes one or more storage resources but does not include compute resources. The first blade (618) may be embodied, for example, as a storage blade such as the storage blade described above with reference to FIG. 4. The storage system depicted in FIG. 6 also includes a second blade (620)

mounted within one of the chassis (606) that includes one or more compute resources but does not include storage resources. The second blade (620) may be embodied, for example, as a compute blade such as the compute blade described above with reference to FIG. 5. The storage system depicted in FIG. 6 also includes a third blade (622) mounted within one of the chassis (610) that includes one or more storage resources and one or more compute resources. The third blade (622) may be embodied, for example, as a hybrid blade such as the hybrid blades described above with reference to FIG. 2 and FIG. 3.

The third blade (622) depicted in FIG. 6 may include a local access interface through which the compute resources in the third blade (622) can access the storage resources in the third blade (622). The compute resources in the third blade (622) may be embodied, for example, as one or more host servers that include a computer processor coupled to memory via a memory bus. The storage resources in the third blade (622) may be embodied, for example, as one or more storage units that include flash memory as well as other forms of memory, such as NVRAM, which will be discussed in greater detail below. In such an example, the compute resources in the third blade (622) may access the storage resources (622) in the third blade (622), for example, via a local access interface such as a data communication bus that forms a data communications path between the compute resources in the third blade (622) and the storage resources (622) in the third blade (622), as well as any other microprocessors, FPGAs, or other computing devices required to carry out data communications between the compute resources in the third blade (622) and the storage resources (622) in the third blade (622).

The third blade (622) depicted in FIG. 6 may also include a remote access interface through which compute resources in a remote blade can access the storage resources in the third blade (622) without utilizing the compute resources in the third blade (622). The remote access interface may be embodied, for example, as a data communications interface in the third blade (622) that enables an FPGA, microprocessor, or other form of computing device that is part of the storage resources in the third blade (622) to couple to a data communications network. In such an example, compute resources on a remote blade may send an instruction to write data to, or read data from, the storage resources on the third blade (622) directly to microprocessor, or other form of computing device that is part of the storage resources in the third blade (622). In such a way, compute resources on a remote blade can directly access storage resources on the third blade (622) without needing to route such an access request through the compute resources on the third blade (622). Readers will appreciate that the remote access interface in the third blade (622) may utilize first data communications protocol while the local access interface in the third blade (622) may utilize a different, second data communications protocol.

The third blade (622) depicted in FIG. 6 may also include a first power interface for delivering power to the compute resources in the third blade (622). The first power interface may be embodied, for example, as a port for coupling to a power source that is external to the third blade (622) and a power distribution bus that couples the port to one or more compute resources such as a host server. The port may be coupled, for example, to a first power supply, to a first power bus that is external to the third blade (622) and provided by the chassis (610) that the blade is mounted within, and so on.

The third blade (622) depicted in FIG. 6 may also include a second power interface for delivering power to the storage resources in the third blade (622). The second power interface may be embodied, for example, as a port for coupling to a power source that is external to the third blade (622) and a power distribution bus that couples the port to one or more storage resources such as one or more storage units. The port may be coupled, for example, to a second power supply, to a second power bus that is external to the third blade (622) and provided by the chassis (610) that the blade is mounted within, and so on.

In the example depicted in FIG. 6, power delivery to the first power interface in the third blade (622) may be controlled independently of power delivery to the second power interface in the third blade (622). Power delivery to the first power interface may be controlled independently of power delivery to the second power interface, for example, because the first power interface is coupled to a first power source and the second power interface is coupled to a second power source. In such an example, powering up or down either power source would result in power delivery to the first power interface being controlled independently of power delivery to the second power interface.

Power delivery to the first power interface may also be controlled independently of power delivery to the second power interface, for example, because the first power interface can be enabled or disabled independently of enabling or disabling the second power interface, the second power interface can be enabled or disabled independently of enabling or disabling the first power interface, and so on. In such an example, each of the power interfaces may include some mechanism that allows the power interface to block the flow of electricity through the power interface, such that the power interface is disabled. Each power interfaces may likewise include some mechanism, which may be the same mechanism as described in the preceding sentence, that allows the power interface to permit the flow of electricity through the power interface, such that the power interface is enabled.

In the example depicted in FIG. 6, the second power interface in the third blade (622) may be included within the remote access interface in the third blade (622). As described above, the remote access interface in the third blade (622) may be embodied as an Ethernet link that enables an FPGA, microprocessor, or other computing device in a storage unit in the third blade (622) to couple to a data communications network. Power may therefore be delivered to the storage unit in the third blade (622) such an Ethernet link, for example, through the use of PoE techniques. In such a way, when a remote blade is accessing the storage unit in the third blade (622) via the remote access interface in the third blade (622), such a storage unit may be powered using remote access interface.

The third blade (622) depicted in FIG. 6 may also include a switching mechanism configured to provide access to the storage resources in the third blade (622), where the switching mechanism is configured to couple to compute resources in the third blade (622) via a first interface and also configured to couple to compute resources on a remote blade via a second interface. The switching mechanism may be coupled to local storage resources via a first interface such as a data communications link that is coupled to compute resources within the third blade (622). The switching mechanism may also be coupled to local storage resources via a second data communications link that is coupled to compute resources on another blade in the storage system, such that the local storage resources may be accessed without utilizing compute resources within the third blade (622). The switching mechanism may be embodied as a mechanical device that can facilitate a data communications connection between a particular storage unit and a plurality of data communications pathways, although at any particular time the switching mechanism may only facilitate data communications between the particular storage unit and a single data communications pathway.

Figure 7:
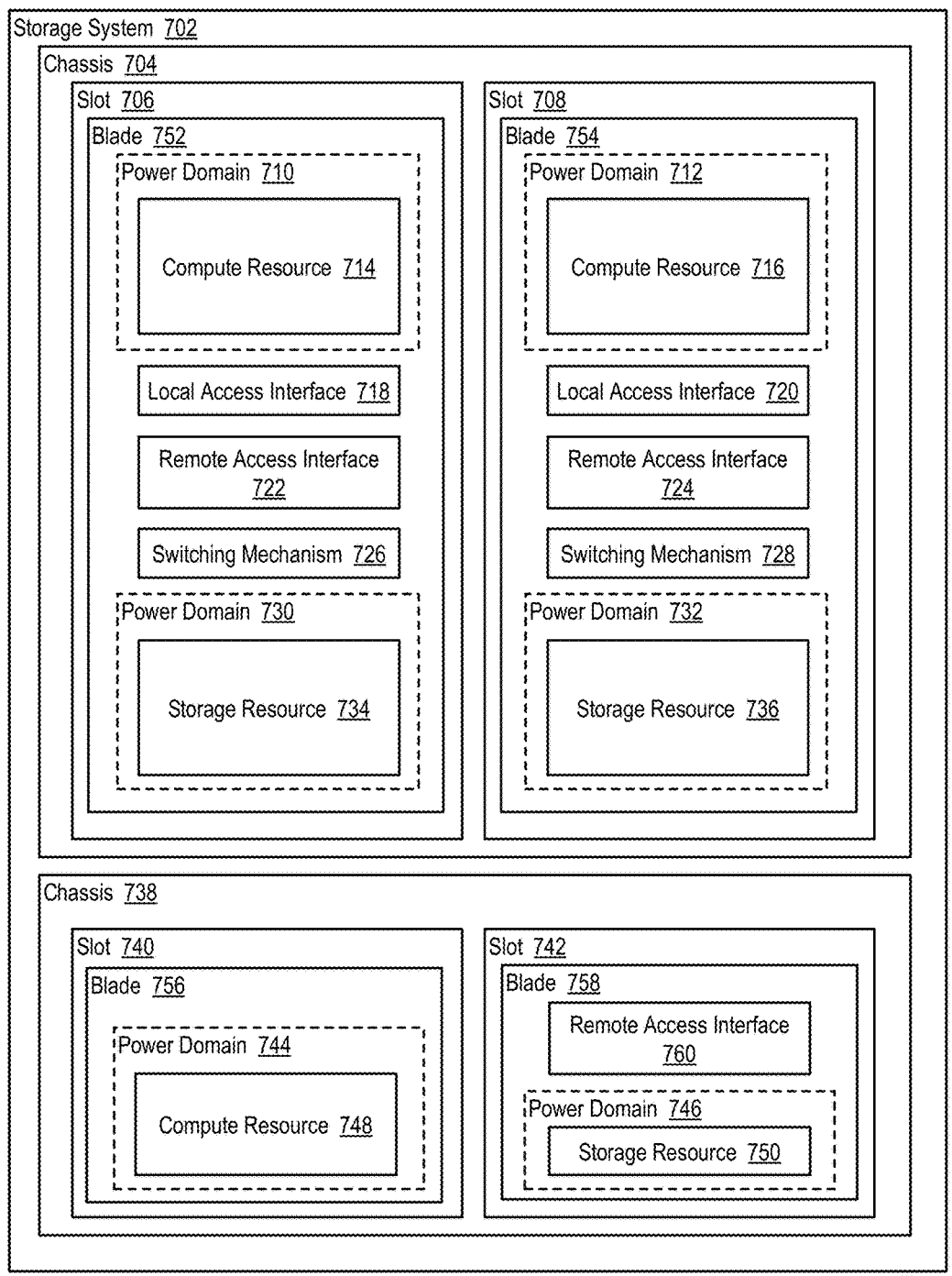
FIG. 7 sets forth a diagram of a storage system that supports independent scaling of compute resources and storage resources according to embodiments of the present disclosure.

For further explanation, FIG. 7 sets forth a diagram of a storage system (702) that supports independent scaling of compute resources and storage resources according to embodiments of the present disclosure. The storage system (702) depicted in FIG. 7 includes one or more chassis (704, 738). Although depicted in less detail, each of the chassis (704, 738) depicted in FIG. 7 may be similar to the chassis described above with reference to FIG. 1, as each chassis (704, 738) includes a plurality of slots, where each slot is configured to receive a blade. Each chassis (704, 738) may include mechanisms, such as one or more power distribution busses, that are utilized to provide power to blades that are mounted within the chassis (704, 738). Each chassis (704, 738) may further include mechanisms, such as one or more communication busses, that facilitate data communications between one or more blades that are mounted within the chassis (704, 738), as well as other data communications devices such as network switches that are mounted within the chassis (704, 738). The communication mechanisms may be embodied, for example, as one or more Ethernet busses, as one or more PCIe busses, as one or more InfiniBand busses, and so on. In some embodiments, each chassis (704, 738) may include at least two instances of both a power distribution mechanism and a communication mechanism, where each instance of the power distribution mechanism and each instance of the communication mechanism may be enabled or disabled independently.

Each chassis (704, 738) depicted in FIG. 7 may also include one or more ports for receiving an external communication bus that enables communication between multiple chassis (704, 738), directly or through a switch, as well as communications between a chassis (704, 738) and an external client system. The external communication bus may use a technology such as Ethernet, InfiniBand, Fibre Channel, and so on. In some embodiments, the external communication bus may use different communication bus technologies for inter-chassis communication than is used for communication with an external client system. In embodiments where one or more switches are deployed, each switch may act as a translation layer between multiple protocols or technologies. When multiple chassis (704, 738) are connected to define a storage cluster, the storage cluster may be accessed by a client using either proprietary interfaces or standard interfaces such a PCIe interface, a SAS interfaces, a SATA interface, or other interface using protocols such as NFS, CIFS, SCSI, HTTP, Object, and so on. Translation from the client protocol may occur at the switch, external communication bus, or within each blade.

Although not explicitly depicted in FIG. 7, each chassis (704, 738) may include one or more modules, data communications busses, or other apparatus that is used to identify which type of blade is inserted into a particular slot of the chassis (704, 738). In such an example, a management module may be configured to request information from each blade in each chassis (704, 738) when each blade is powered on, when the blade is inserted into a chassis (704, 738), or at some other time. The information received by the management module can include, for example, a special purpose identifier maintained by the blade that identifies the type (e.g., storage blade, compute blade, hybrid blade) of blade that has been inserted into the chassis (704, 738). In an alternative embodiment, each blade may be configured to automatically provide such information to a management module as part of a registration process.

The storage system (702) depicted in FIG. 7 also includes a plurality of compute resources (714, 716, 748). The compute resources (714, 716, 748) in the storage system (702) depicted in FIG. 7 may be embodied, for example, as one or more host servers such as the host servers described above with reference to FIGS. 2, 3, and 5. Such host servers may reside in blades (752, 754, 756) that are mounted within one or more slots (706, 708, 740) in the storage system (702).

The storage system (702) depicted in FIG. 7 also includes a plurality of storage resources (734, 736, 750). The storage resources (734, 736, 750) in the storage system (702) depicted in FIG. 7 may be embodied, for example, as one or more storage units such as the storage units described above with reference to FIGS. 2, 3, and 4. Such storage units may reside in blades (752, 754, 758) that are mounted within one or more slots (706, 708, 742) in the storage system (702).

The storage system (702) depicted in FIG. 7 also includes a plurality of blades (752, 754, 756, 758). In the example depicted in FIG. 7, each of the blades (752, 754, 756, 758) includes at least one compute resource (714, 716, 748) or at least one storage resource (734, 736, 750). Each of the blades (752, 754, 756, 758) may therefore be embodied, for example, as a hybrid blade, as a compute blade, or as a storage blade as described above with reference to FIGS. 2, 3, 4, and 5.

In the example storage system (702) depicted in FIG. 7, each of the storage resources (734, 736, 750) may be directly accessed by each of the compute resources (714, 716, 748) without utilizing an intermediate compute resource (714, 716, 748). Each of the storage resources (734, 736, 750) may be directly accessed by each of the compute resources (714, 716, 748) without utilizing an intermediate compute resource (714, 716, 748), for example, through the use of a remote access interface that provides access to the storage resources (734, 736, 750). Such a remote access interface may be embodied, for example, as an Ethernet link is coupled to an FPGA in a storage unit, thereby enabling the storage unit to be coupled for data communications with a data communications network that each of the remote compute resources (714, 716, 748) may also be coupled to. In such an example, compute resources on a remote blade can access a storage unit on a local blade without utilizing the compute resources on the local blade as the compute resources on the remote blade may send an instruction to write data to, or read data from, the storage unit, without routing such an instruction through compute resources on the local blade.

In the example depicted in FIG. 7, the storage system (702) also includes a first power domain configured to deliver power to one or more of the compute resources. The first power domain may be embodied, for example, as a power supply, power distribution bus, and power interface to a host server, where the first power interface is configured to deliver power to one or more of the compute resources. In the example depicted in FIG. 7, three power domains (710, 712, 744) are depicted that may serve as distinct instances of a first power domain that is configured to deliver power to one or more of the compute resources (714, 716, 748). Readers will appreciate that although each of the compute resources (714, 716, 748) depicted in FIG. 7 receive power from a distinct instance of a first power domain, in other embodiments, one or more of the compute resources (714, 716, 748) may be configured to receive power from the same instance of a first power domain, such that multiple compute resources (714, 716, 748) may be powered up or powered down by enabling or disabling the delivery of power by a single instance of a first power domain.

In the example depicted in FIG. 7, the storage system (702) also includes a second power domain configured to deliver power to the storage resources. The second power domain may be embodied, for example, as a power supply, power distribution bus, and power interface to a storage unit, where the second power domain is configured to deliver power to one or more of the storage resources. In the example depicted in FIG. 7, three power domains (730, 732, 746) are depicted that may serve as distinct instances of a second power domain that is configured to deliver power to one or more of the storage resources (734, 736, 750). Readers will appreciate that although each of the storage resources (734, 736, 750) depicted in FIG. 7 receive power from a distinct instance of a second power domain, in other embodiments, one or more of the storage resources (734, 736, 750) may be configured to receive power from the same instance of a second power domain, such that multiple storage resources (734, 736, 750) may be powered up or powered down by enabling or disabling the delivery of power by a single instance of a second power domain.

The preceding paragraphs describe non-limiting, example embodiments of a first power domain and a second power domain. In some embodiments, the first power domain and the second power domain may include fewer or additional components. The first power domain and the second power domain may also be configured to deliver power to components within the storage system (702) in coordination with components such as, for example, external power supplies, external power busses, external data communications networks, and so on. The first power domain and the second power domain may also be coupled to receive power from the same power source (e.g., the same power supply), so long as the delivery of power to one or more compute resources (714, 716, 748) may be enabled or disabled independently of the delivery of power to one or more storage resources (734, 736, 750), and vice versa. In an embodiment where the first power domain and the second power domain receive power from the same power source, the delivery of power to one or more compute resources (714, 716, 748) may be enabled or disabled independently of the delivery of power to one or more storage resources (734, 736, 750), and vice versa, through the use of a switching mechanism, power delivery network, or other mechanism that enables the delivery of power to each power domain to be blocked or enabled independently. Readers will appreciate that additional embodiments are possible that are consistent with the spirit of the present disclosure.

In the example depicted in FIG. 7, each instance of a first power domain can be operated independently of each instance of a second power domain. Each instance of a first power domain can be operated independently of each instance of a second power domain as the power interfaces within each power domain (710, 712, 730, 732, 744, 746) may be enabled or disabled independently, the distinct power supplies that provide power to each power domain (710, 712, 730, 732, 744, 746) may be enabled or disabled independently, the distinct power busses that are included in each power domain (710, 712, 730, 732, 744, 746) may be enabled or disabled independently, and so on. In such a way, the delivery of power to one or more compute resources (714, 716, 748) may be enabled or disabled independently of the delivery of power to one or more storage resources (734, 736, 750), and vice versa. Because the delivery of power to one or more compute resources (714, 716, 748) may be enabled or disabled independently of the delivery of power to one or more storage resources (734, 736, 750), independent scaling of each type of resources may be achieved by enabling or disabling the delivery of power to only one type (i.e., storage or compute) of resource. For example, enabling the delivery of power to one or more storage resources increases the amount of storage resources available in the storage system (702) without impacting the amount of compute resources available in the storage system (702), disabling the delivery of power to one or more storage resources decreases the amount of storage resources available in the storage system (702) without impacting the amount of compute resources available in the storage system (702), enabling the delivery of power to one or more compute resources increases the amount of compute resources available in the storage system (702) without impacting the amount of storage resources available in the storage system (702), disabling the delivery of power to one or more compute resources decreases the amount of compute resources available in the storage system (702) without impacting the amount of storage resources available in the storage system (702), and so on.

The storage system (702) depicted in FIG. 7 includes a blade (756) that includes compute resources (748) but does not include storage resources. Although the blade (756) that includes compute resources (748) but does not include storage resources is depicted in less detail, readers will appreciate that the blade (756) may be similar to the compute blade described above with reference to FIG. 5. The storage system (702) depicted in FIG. 7 also includes a blade (758) that includes storage resources (750) but does not include any compute resources. Although the blade (758) that includes storage resources (750) but does not include any compute resources is depicted in less detail, readers will appreciate that the blade (758) may be similar to the storage blade described above with reference to FIG. 4. The storage system (702) depicted in FIG. 7 also includes blades (752, 754) that include storage resources (734, 736) and compute resources (714, 716). Although the blades (752, 754) that include storage resources (734, 736) and compute resources (714, 716) are depicted in less detail, readers will appreciate that the blades (752, 754) may be similar to the hybrid blades described above with reference to FIG. 2 and FIG. 3.

In the example depicted in FIG. 7, each of the blades (752, 754) that include storage resources (734, 736) and compute resources (714, 716) can also include a local access interface (718, 720) through which the local compute resources (714, 716) can access the local storage resources (734, 736). Each local access interface (718, 720) may be embodied, for example, as a data communication bus that forms a data communications path between the compute resources (714, 716) in a particular blade (752, 754) and one or more storage resources (734, 736) within the same particular blade (752, 754), as well as any other microprocessors, FPGAs, or other computing devices required to carry out data communications between the compute resources (714, 716) in a particular blade (752, 754) and one or more storage resources (734, 736) within the same particular blade (752, 754).

In the example depicted in FIG. 7, each of the blades (752, 754) that include storage resources (734, 736) and compute resources (714, 716) can also include a remote access interface (722, 724) through which compute resources (748) on a remote blade (756) can access the local storage resources (734, 736) without utilizing the local compute resources (714, 716). Each remote access interface (722, 724) may be embodied, for example, as a data communications interface in each of the blades (752, 754) that enables an FPGA, microprocessor, or other form of computing device that is part of the storage resources (734, 736) in a particular blade (752, 754) to couple to a data communications network. In such an example, compute resources (714, 716, 748) on a remote blade (752, 754, 756) may send an instruction to write data to, or read data from, the storage resources (734, 736) in a different blade (752, 754) directly to microprocessor, or other form of computing device that is part of the storage resources (734, 736) in the different blade (752, 754). For example, compute resources (714, 748) on two of the blades (752, 756) may directly send an instruction to write data to, or read data from, the storage resources (736) in another blade (754) without utilizing the compute resources (716) on the targeted blade (754), compute resources (716, 748) on two of the blades (754, 756) may directly send an instruction to write data to, or read data from, the storage resources (734) in another blade (752) without utilizing the compute resources (714) on the targeted blade (752), and so on.

In the example depicted in FIG. 7, each of the blades (752, 754) that include storage resources (734, 736) and compute resources (714, 716) can also include a switching mechanism (728, 728) configured to provide access to the local storage resources (734, 736), where the switching mechanism (726, 728) is coupled to the local compute resources (714, 716) via the local access interface (718, 720) and the switching mechanism (726, 728) is coupled to the compute resources (714, 716, 748) on a remote blade (752, 754, 756) via a remote access interface (722, 724). For example, the switching mechanism (726) in one of the illustrated blades (752) may be coupled to the local compute resources (714) on the illustrated blade (752) via the local access interface (718) and the switching mechanism (726, 728) may also be coupled to the compute resources (716, 748) on a remote blade (754, 756) via a remote access interface (722) on the illustrated blade (752). Likewise, the switching mechanism (728) in another illustrated blade (754) may be coupled to its local compute resources (716) via the local access interface (720) and the switching mechanism (728) may also be coupled to the compute resources (714, 748) on a remote blade (752, 756) via a remote access interface (724) on the blade (754). In the example depicted in FIG. 7, each switching mechanism (726, 728) may be similar to the switching mechanisms described above with reference to FIG. 3.

In the example depicted in FIG. 7, each remote access interface (722, 724) may utilize a first data communications protocol and each local access interface (718, 720) may utilize a second data communications protocol. For each, the storage resources (734, 736) may be accessed by local compute resources (714, 716) via the local access interface (718, 720) by utilizing a PCIe data communications link whereas the storage resources (734, 736) may be accessed by compute resources (714, 716, 748) on a remote blade (752, 754, 756) via the remote access interface (722, 724) by utilizing an Ethernet data communications link.

In the example depicted in FIG. 7, each of the blades (752, 754) that include storage resources (734, 736) and compute resources (714, 716) can also include a first local power domain (710, 712) configured to deliver power to the local compute resources (714, 716). The first local power domain (710, 712) in each of the blades (752, 754) that include storage resources (734, 736) and compute resources (714, 716) may be embodied, for example, as a power supply, power distribution bus, and power interface to a host server, where the first power interface is configured to deliver power to one or more of the compute resources (714, 716) in the blade (752, 754). In the example depicted in FIG. 7, each of the blades (752, 754) that include storage resources (734, 736) and compute resources (714, 716) can also include a second local power domain (730, 732) configured to deliver power to the local storage resources (734, 736). The second local power domain (730, 732) in each of the blades (752, 754) that include storage resources (734, 736) and compute resources (714, 716) may be embodied, for example, as a power supply, power distribution bus, and power interface to a storage unit, where the second power domain is configured to deliver power to one or more of the storage resources (734, 736) in the blade (752, 754).

Readers will appreciate that, for each of the blades (752, 754) that include storage resources (734, 736) and compute resources (714, 716), the first local power domain (710, 712) and the second local power domain (730, 732) may be independently operated. The first local power domain (710, 712) and the second local power domain (730, 732) in a particular blade (752, 754) may be operated independently as the power interfaces within each power domain (710, 712, 730, 732) may be enabled or disabled independently, the distinct power supplies that provide power to each power domain (710, 712, 730, 732) may be enabled or disabled independently, the distinct power busses that are included in each power domain (710, 712, 730, 732) may be enabled or disabled independently, and so on. In such a way, the delivery of power to one or more compute resources (714, 716) may be enabled or disabled independently of the delivery of power to one or more storage resources (734, 736), and vice versa.

In the example depicted in FIG. 7, the storage resources (734, 736, 750) within at least one blade (752, 754, 756) may receive power via a remote access interface. As described above, the storage resources (734, 736, 750) within each blade (752, 754, 756) may be accessed via a remote access interface (722, 724, 760). Such remote access interface (722, 724, 760) can include an Ethernet link that enables a storage unit to couple to a data communications network. Power may therefore be delivered to the storage resources (734, 736, 750), for example, through the use of PoE techniques. In such a way, when a remote blade is accessing the storage resources (734, 736, 750) within a particular blade (752, 754, 758) via the remote access interface (722, 724, 760), the storage resources (734, 736, 750) may be powered using the remote access interface (722, 724, 760). In alternative embodiments, power may be provided to the storage resources (734, 736, 750) in different ways.

Figure 8:
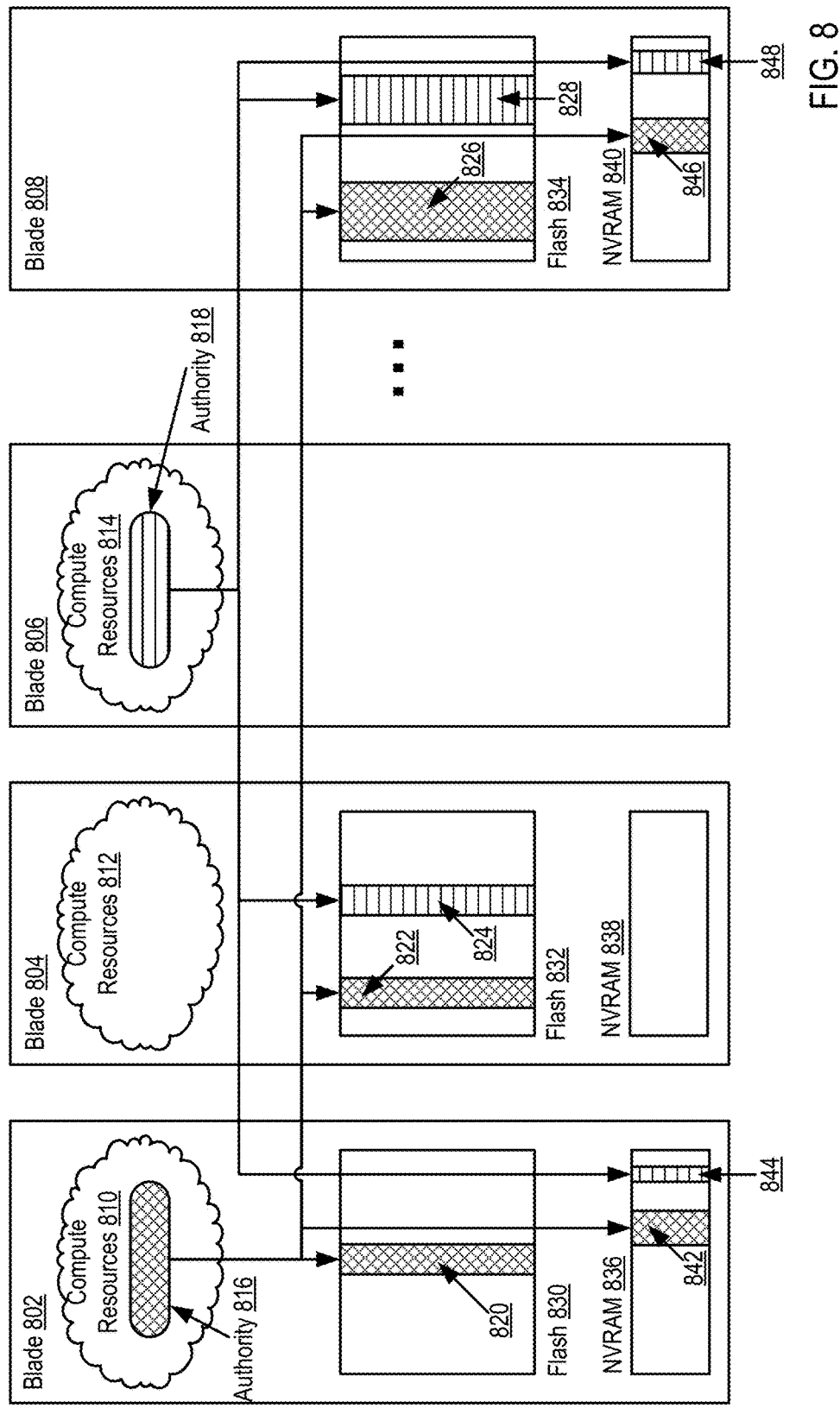
FIG. 8 sets forth a diagram of a set of blades useful in a storage system that supports independent scaling of compute resources and storage resources according to embodiments of the present disclosure.

For further explanation, FIG. 8 sets forth a diagram of a set of blades (802, 804, 806, 808) useful in a storage system that supports independent scaling of compute resources and storage resources according to embodiments of the present disclosure. Although blades will be described in greater detail below, the blades (802, 804, 806, 808) depicted in FIG. 8 may include compute resources (810, 812, 814), storage resources in the form of flash memory (830, 832, 834), storage resources in the form of non-volatile random access memory ('NVRAM') (836, 838, 840), or any combination thereof. In the example depicted in FIG. 8, the blades (802, 804, 806, 808) are of differing types. For example, one blade (806) includes only compute resources (814), another blade (808) includes only storage resources, depicted here as flash (834) memory and NVRAM (840), and two of the blades (802, 804) include compute resources (810, 812) as well as storage resources in the form of flash (830, 832) memory and NVRAM (836, 838). In such of an example, the blade (806) that includes only compute resources (814) may be referred to as a compute blade, the blade (808) that includes only storage resources may be referred to as a storage blade, and the blades (802, 804) that include both compute resources (810, 812) and storage resources may be referred to as a hybrid blade.

The compute resources (810, 812, 814) depicted in FIG. 8 may be embodied, for example, as one or more computer processors, as well as memory that is utilized by the computer processor but not included as part of general storage within the storage system. The compute resources (810, 812, 814) may be coupled for data communication with other blades and with external client systems, for example, via one or more data communication busses that are coupled to the compute resources (810, 812, 814) via one or more data communication adapters.

The flash memory (830, 832, 834) depicted in FIG. 8 may be embodied, for example, as multiple flash dies which may be referred to as packages of flash dies or an array of flash dies. Such flash dies may be packaged in any number of ways, with a single die per package, multiple dies per package, in hybrid packages, as bare dies on a printed circuit board or other substrate, as encapsulated dies, and so on. Although not illustrated in FIG. 8, an input output (I/O) port may be coupled to the flash dies and a direct memory access ('DMA') unit may also be coupled directly or indirectly to the flash dies. Such components may be implemented, for example, on a programmable logic device ('PLD') such as a field programmable gate array ('FPGA'). The flash memory (830, 832, 834) depicted in FIG. 8 may be organized as pages of a predetermined size, blocks that include a predetermined number of pages, and so on.

The NVRAM (836, 838, 840) depicted in FIG. 8 may be embodied, for example, as one or more non-volatile dual in-line memory modules ('NVDIMMs'), as one more DRAM dual in-line memory modules ('DIMMs') that receive primary power through a DIMM slot but are also attached to a backup power source such as a supercapacitor, and so on. The NVRAM (836, 838, 840) depicted in FIG. 8 may be utilized as a memory buffer for temporarily storing data that will be written to flash memory (830, 832, 834), as writing data to the NVRAM (836, 838, 840) may be carried out more quickly than writing data to flash memory (830, 832, 834). In this way, the latency of write requests may be significantly improved relative to a system in which data is written directly to the flash memory (830, 832, 834).

In the example method depicted in FIG. 8, a first blade (802) includes a first authority (816) that is executing on the compute resources (810) within the first blade (802) and a second blade (806) includes a second authority (818) that is executing on the compute resources (814) within the second blade (806). Each authority (816, 818) represents a logical partition of control and may be embodied as a module of software executing on the compute resources (810, 812, 814) of a particular blade (802, 804, 806). Each authority (816, 818) may be configured to control how and where data is stored in storage system. For example, authorities (816, 818) may assist in determining which type of erasure coding scheme is applied to the data, authorities (816, 818) may assist in determining where one or more portions of the data may be stored in the storage system, and so on. Each authority (816, 818) may control a range of inode numbers, segment numbers, or other data identifiers which are assigned to data by a file system or some other entity.

Each authority (816, 818) may operate independently and autonomously on its partition of each of the entity spaces defined within the system. Each authority (816, 818) may serve as an independent controller over those spaces, each providing its own data and metadata structures, its own background workers, and maintaining its own lifecycle. Each authority (816, 818) may, for example, allocate its own segments, maintains its own log/pyramid, maintain its own NVRAM, define its own sequence ranges for advancing persistent state, boot independently, and so on.

Readers will appreciate that every piece of data and every piece of metadata stored in the storage system is owned by a particular authority (816, 818). Each authority (816, 818) may cause data that is owned by the authority (816, 818) to be stored within storage that is located within the same blade whose computing resources are supporting the authority (816, 818) or within storage that is located on some other blade. In the example depicted in FIG. 8:

a. The authority (816) that is executing on the compute resources (810) within a first blade (802) has caused data to be stored within a portion (820) of flash (830) that is physically located within the first blade (802).
b. The authority (816) that is executing on the compute resources (810) within a first blade (802) has also caused data to be stored in a portion (842) of NVRAM (836) that is physically located within the first blade (802).
c. The authority (816) that is executing on the compute resources (810) within the first blade (802) has also caused data to be stored within a portion (822) of flash (832) on the second blade (804) in the storage system.
d. The authority (816) that is executing on the compute resources (810) within the first blade (802) has also caused data to be stored within a portion (826) of flash (834) and a portion (846) of NVRAM (840) on the fourth blade (808) in the storage system.
e. The authority (818) that is executing on the compute resources (814) within the third blade (802) has caused data to be stored within a portion (844) of NVRAM (836) that is physically located within the first blade (802).
f. The authority (818) that is executing on the compute resources (814) within the third blade (802) has also caused data to be stored within a portion (824) of flash (832) within the second blade (804).
g. The authority (818) that is executing on the compute resources (814) within the third blade (802) has also caused data to be stored within a portion (828) of flash (834) within the fourth blade (808).
h. The authority (818) that is executing on the compute resources (814) within the third blade (802) has also caused data to be stored within a portion (848) of NVRAM (840) within the fourth blade (808).

Readers will appreciate that many embodiments other than the embodiment depicted in FIG. 8 are contemplated as it relates to the relationship between data, authorities, and system components. In some embodiments, every piece of data and every piece of metadata has redundancy in the storage system. In some embodiments, the owner of a particular piece of data or a particular piece of metadata may be a ward, with an authority being a group or set of wards.

Likewise, in some embodiments there are redundant copies of authorities. In some embodiments, authorities have a relationship to blades and the storage resources contained therein. For example, each authority may cover a range of data segment numbers or other identifiers of the data and each authority may be assigned to a specific storage resource. Data may be stored in a segment according to some embodiments of the present disclosure, and such segments may be associated with a segment number which serves as indirection for a configuration of a RAID stripe. A segment may identify a set of storage resources and a local identifier into the set of storage resources that may contain data. In some embodiments, the local identifier may be an offset into a storage device and may be reused sequentially by multiple segments. In other embodiments the local identifier may be unique for a specific segment and never reused. The offsets in the storage device may be applied to locating data for writing to or reading from the storage device.

Readers will appreciate that if there is a change in where a particular segment of data is located (e.g., during a data move or a data reconstruction), the authority for that data segment should be consulted. In order to locate a particular piece of data, a hash value for a data segment may be calculated, an inode number may be applied, a data segment number may be applied, and so on. The output of such an operation can point to a storage resource for the particular piece of data. In some embodiments the operation described above may be carried out in two stages. The first stage maps an entity identifier (ID) such as a segment number, an inode number, or directory number to an authority identifier. This mapping may include a calculation such as a hash or a bit mask. The second stage maps the authority identifier to a particular storage resource, which may be done through an explicit mapping. The operation may be repeatable, so that when the calculation is performed, the result of the calculation reliably points to a particular storage resource. The operation may take the set of reachable storage resources as input, and if the set of reachable storage resources changes, the optimal set changes. In some embodiments, a persisted value represents the current assignment and the calculated value represents the target assignment the cluster will attempt to reconfigure towards.

The compute resources (810, 812, 814) within the blades (802, 804, 806) may be tasked with breaking up data to be written to storage resources in the storage system. When data is to be written to a storage resource, the authority for that data is located as described above. When the segment ID for data is already determined, the request to write the data is forwarded to the blade that is hosting the authority, as determined using the segment ID. The computing resources on such a blade may be utilized to break up the data and transmit the data for writing to a storage resource, at which point the transmitted data may be written as a data stripe in accordance with an erasure coding scheme. In some embodiments, data is requested to be pulled and in other embodiments data is pushed. When compute resources (810, 812, 814) within the blades (802, 804, 806) are tasked with reassembling data read from storage resources in the storage system, the authority for the segment ID containing the data is located as described above.

The compute resources (810, 812, 814) within the blades (802, 804, 806) may also be tasked with reassembling data read from storage resources in the storage system. The compute resources (810, 812, 814) that support the authority that owns the data may request the data from the appropriate storage resource. In some embodiments, the data may be read from flash storage as a data stripe. The compute resources (810, 812, 814) that support the authority that owns the data may be utilized to reassemble the read data, including correcting any errors according to the appropriate erasure coding scheme, and forward the reassembled data to the network. In other embodiments, breaking up and reassembling data, or some portion thereof, may be performed by the storage resources themselves.

The preceding paragraphs discuss the concept of a segment. A segment may represent a logical container of data in accordance with some embodiments. A segment may be embodied, for example, as an address space between medium address space and physical flash locations. Segments may also contain metadata that enables data redundancy to be restored (rewritten to different flash locations or devices) without the involvement of higher level software. In some embodiments, an internal format of a segment contains client data and medium mappings to determine the position of that data. Each data segment may be protected from memory and other failures, for example, by breaking the segment into a number of data and parity shards. The data and parity shards may be distributed by striping the shards across storage resources in accordance with an erasure coding scheme.

The examples described above relate, at least to some extent, to chassis for use in a storage system that supports independent scaling of compute resources and storage resources, blades for use in storage systems that support independent scaling of compute resources and storage resources, and storage systems that support independent scaling of compute resources and storage resources. Readers will appreciate that the resources that are independently scaled, compute resources and storage resources, are those resources that are generally available to users of the storage system. For example, the storage resources that are independently scaled may be storage resources that a user of the storage system can use to persistently store user data. Likewise, the compute resources that are independently scaled may be compute resources that a user of the storage system can use to support the execution of applications, authorities, and the like.

Readers will appreciate that while the host servers described above with reference to FIGS. 2, 3, and 5 include memory, such memory is not considered to be part of the storage resources that are independently scaled. Such memory is included in the host server for the purpose of supporting the execution of instructions by a processor that is also included in the host server. Such memory is not, however, included in the host server for the purpose of expanding the amount of storage that a storage system that includes the blades depicted in FIGS. 2, 3, and 5 can make available to users of the storage system. As such, a compute blade is described above as lacking storage resources, in spite of the fact that the compute blade can include some form of memory that may be used to support the execution of computer program instructions by the compute resources in the compute blade.

Readers will similarly appreciate that while the storage units described above with reference to FIGS. 2, 3, and 4 include an ARM and an FPGA, such devices are not considered to be part of the compute resources that are independently scaled. Such devices are included in the storage units for the purpose of accessing storage in the storage units in much the same way that a memory controller accesses memory. Such devices are not, however, included in the storage units for the purpose of expanding the amount of computing resources that a storage system that includes the blades depicted in FIGS. 2, 3, and 4 can make available to users of the storage system. As such, a storage blade is described above as lacking compute resources, in spite of the fact that the storage blade can include some devices that may be used to support the execution of computer program instructions that read and write data to attached storage.

Figure 9:
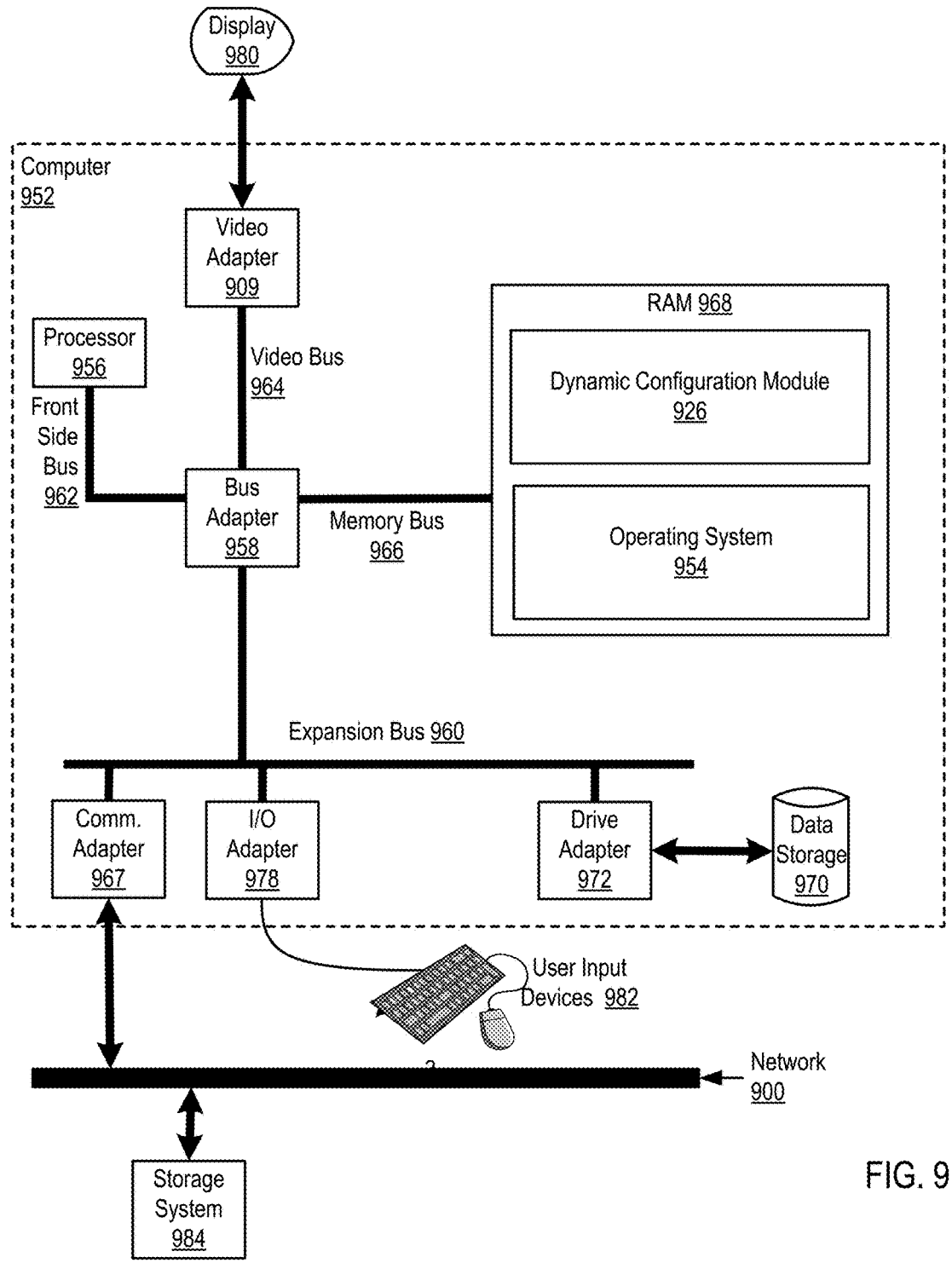
FIG. 9 sets forth a block diagram of automated computing machinery comprising an example computer useful in supporting independent scaling of compute resources and storage resources according to embodiments of the present disclosure.

For further explanation, FIG. 9 sets forth a block diagram of automated computing machinery comprising an example computer (952) useful in supporting independent scaling of compute resources and storage resources according to embodiments of the present disclosure. The computer (952)

of FIG. 9 includes at least one computer processor (956) or "CPU" as well as random access memory ("RAM") (968) which is connected through a high speed memory bus (966) and bus adapter (958) to processor (956) and to other components of the computer (952). Stored in RAM (968) is a dynamic configuration module (926), a module of computer program instructions for useful in supporting independent scaling of compute resources and storage resources according to embodiments of the present disclosure. The dynamic configuration module (926) may be configured for supporting independent scaling of compute resources and storage resources by performing a variety of support functions such as, for example, detecting the insertion of a blade into a chassis through the receipt of one or more device registration messages, admitting a blade that has been powered up into the storage system, logically removing a blade that has been powered down from the storage system, maintaining information identifying available and unavailable resources in the storage system, and so on.

Also stored in RAM (968) is an operating system (954). Operating systems useful in computers configured for supporting independent scaling of compute resources and storage resources according to embodiments described herein include UNIX™, Linux™, Microsoft XP™, AIX™, IBM's i5/OS™, and others as will occur to those of skill in the art. The operating system (954) and dynamic configuration module (926) in the example of FIG. 9 are shown in RAM (968), but many components of such software typically are stored in non-volatile memory also, such as, for example, on a disk drive (970).

The example computer (952) of FIG. 9 also includes disk drive adapter (972) coupled through expansion bus (960) and bus adapter (958) to processor (956) and other components of the computer (952). Disk drive adapter (972) connects non-volatile data storage to the computer (952) in the form of disk drive (970). Disk drive adapters useful in computers configured for supporting independent scaling of compute resources and storage resources according to embodiments described herein include Integrated Drive Electronics ("IDE") adapters, Small Computer System Interface ("SCSI") adapters, and others as will occur to those of skill in the art. Non-volatile computer memory also may be implemented for as an optical disk drive, electrically erasable programmable read-only memory (so-called "EEPROM" or "Flash" memory), RAM drives, and so on, as will occur to those of skill in the art.

The example computer (952) of FIG. 9 includes one or more input/output ("I/O") adapters (978). I/O adapters implement user-oriented input/output through, for example, software drivers and computer hardware for controlling output to display devices such as computer display screens, as well as user input from user input devices (982) such as keyboards and mice. The example computer (952) of FIG. 9 includes a video adapter (909), which is an example of an I/O adapter specially designed for graphic output to a display device (980) such as a display screen or computer monitor. Video adapter (909) is connected to processor (956) through a high speed video bus (964), bus adapter (958), and the front side bus (962), which is also a high speed bus.

The example computer (952) of FIG. 9 includes a communications adapter (967) for data communications with a storage system (984) as described above and for data communications with a data communications network (900). Such data communications may be carried out serially through RS-232 connections, through external buses such as a Universal Serial Bus ('USB'), a Fibre Channel data communications link, an Infiniband data communications link, through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for supporting independent scaling of compute resources and storage resources according to embodiments described herein include Ethernet (IEEE 802.3) adapters for wired data communications, Fibre Channel adapters, Infiniband adapters, and so on.

The computer (952) may implement certain instructions stored on RAM (968) for execution by processor (956) for supporting independent scaling of compute resources and storage resources. In some embodiments, dynamically configuring the storage system to facilitate independent scaling of resources may be implemented as part of a larger set of executable instructions. For example, the dynamic configuration module (926) may be part of an overall system management process.

It will be further understood from the foregoing description that modifications and changes may be made in various embodiments of the present disclosure without departing from its true spirit. The descriptions in this specification are for purposes of illustration only and are not to be construed in a limiting sense.

What is claimed is:

1. A storage system comprising:
one or more chassis, wherein each chassis includes a plurality of slots, each slot configured to receive a blade;
a first blade mounted within one of the slots of the one or more chassis, wherein the first blade includes one or more storage resources but does not include compute resources;
a second blade mounted within one of the slots of the one or more chassis, wherein the second blade includes one or more compute resources but does not include storage resources for user data; and
a third blade mounted within one of the slots of the one or more chassis, wherein the third blade includes:
one or more storage resources;
one or more compute resources;
a local access interface through which the one or more compute resources in the third blade accesses the one or more storage resources in the third blade;
a remote access interface through which one or more compute resources in a remote blade, other than the third blade, in the one or more chassis accesses the one or more storage resources in the third blade without utilizing the one or more compute resources in the third blade;
a first power interface for delivering power to the one or more compute resources in the third blade; and
a second power interface for delivering power to the one or more storage resources in the third blade, wherein the first power interface is coupled to a first power source and the second power interface is coupled to a second power source.

2. The storage system of claim 1, wherein the third blade also includes a switching mechanism configured to provide access to the one or more storage resources in the third blade, wherein the switching mechanism is coupled to the one or more compute resources in the third blade via a first interface and wherein the switching mechanism is coupled to the one or more compute resources on the remote blade via a second interface.

3. The storage system of claim 1, wherein power delivery to the first power interface is controlled independently of power delivery to the second power interface, and wherein each power interface includes multiple instances and each of the multiple instances associated with separate resources comprising subsets of the compute resources and the storage resources in the blades of the system, each of the multiple instances controlled independently.

4. The storage system of claim 1, wherein the first power interface is enabled or disabled independently of enabling or disabling the second power interface.

5. The storage system of claim 1, wherein the second power interface is enabled or disabled independently of enabling or disabling the first power interface.

6. The storage system of claim 1, wherein the second power interface is included within the remote access interface.

7. The storage system of claim 1, wherein a single power source provides power to both the first power interface and the second power interface.

8. The storage system of claim 1, wherein the remote access interface utilizes a first data communications protocol and the local access interface utilizes a second data communications protocol, the first data communication protocol differing from the second data communication protocol.

9. A hybrid blade comprising:
 a local access interface through which local compute resources accesses local storage resources;
 a remote access interface through which compute resources on a remote blade accesses the local storage resources without utilizing the local compute resources;
 a first local power domain configured to deliver power to the local compute resources; and
 a second local power domain configured to deliver power to the local storage resources, wherein the first local power domain and the second local power domain are independently operated, wherein each power domain includes multiple instances and each of the multiple instances associated with separate resources of the system, each of the multiple instances controlled independently.

10. The hybrid blade of claim 9 further comprising a switching mechanism configured to provide access to the local storage resources, wherein the switching mechanism is configured to couple to the local compute resources via a first interface and the switching mechanism is configured to couple to remote compute resources via a second interface.

11. The hybrid blade of claim 9, wherein the second local power domain includes the remote access interface and power is delivered to the local storage resources via the remote access interface.

12. The hybrid blade of claim 9, wherein the remote access interface is an Ethernet interface and the local access interface is a Peripheral Component Interconnect Express (PCIe') interface.

* * * * *